(12) United States Patent
Oyer et al.

(10) Patent No.: US 11,227,970 B1
(45) Date of Patent: Jan. 18, 2022

(54) LIGHT EMITTING DIODES MANUFACTURE AND ASSEMBLY

(71) Applicant: Facebook Technologies, LLC, Menlo Park, CA (US)

(72) Inventors: Céline Claire Oyer, Cork (IE); Allan Pourchet, Cork (IE)

(73) Assignee: Facebook Technologies, LLC, Menlo Park, CA (US)

(*) Notice: Subject to any disclaimer, the term of this patent is extended or adjusted under 35 U.S.C. 154(b) by 0 days.

(21) Appl. No.: 16/595,870

(22) Filed: Oct. 8, 2019

Related U.S. Application Data

(60) Provisional application No. 62/747,460, filed on Oct. 18, 2018.

(51) Int. Cl.
| | | |
|---|---|---|
| *H01L 33/00* | (2010.01) | |
| *H01L 33/62* | (2010.01) | |
| *H01L 33/06* | (2010.01) | |
| *H01L 21/66* | (2006.01) | |
| *H01L 21/683* | (2006.01) | |

(52) U.S. Cl.
CPC ...... *H01L 33/0095* (2013.01); *H01L 21/6838* (2013.01); *H01L 22/14* (2013.01); *H01L 33/06* (2013.01); *H01L 33/62* (2013.01); *H01L 2933/0033* (2013.01); *H01L 2933/0066* (2013.01)

(58) Field of Classification Search
CPC ............. H01L 25/0753; H01L 33/0093; H01L 33/0095; H01L 22/14; H01L 2224/97
See application file for complete search history.

(56) References Cited

U.S. PATENT DOCUMENTS

| 10,326,045 B2* | 6/2019 | Lo ........................... H01L 33/44 |
|---|---|---|
| 2005/0059178 A1 | 3/2005 | Erchak et al. |
| 2005/0145864 A1 | 7/2005 | Sugiyama et al. |
| 2005/0264172 A1 | 12/2005 | Wojnarowski et al. |

(Continued)

OTHER PUBLICATIONS

U.S. Appl. No. 16/595,948, "Non-Final Office Action", dated Dec. 31, 2020, 12 pages.

(Continued)

*Primary Examiner* — Zandra V Smith
*Assistant Examiner* — John M Parker
(74) *Attorney, Agent, or Firm* — Kilpatrick Townsend & Stockton LLP

(57) ABSTRACT

A method for manufacturing LED devices is provided. The method comprises forming an epitaxial layer on a starter substrate, the epitaxial layer having a first surface that interfaces with the starter substrate and a second surface opposite to the first surface; establishing an adhesive bond between the second surface of the epitaxial layer and a carrier substrate having a pre-determined light transmittance; etching away the starter substrate; etching away part of the epitaxial layer to form a plurality of light emitting diode (LED) dies on a third surface of the epitaxial layer opposite to the second surface; establishing one or more conductive bonds between selected one or more LED dies, from the plurality of LED dies, and a backplane; weakening the adhesive bond between the second surface of the epitaxial layer and the carrier substrate; and moving the carrier substrate away from the backplane.

20 Claims, 13 Drawing Sheets

(56) References Cited

U.S. PATENT DOCUMENTS

| | | |
|---|---|---|
| 2006/0057850 A1* | 3/2006 | Britt .................... H01L 21/6836 |
| | | 438/690 |
| 2006/0113638 A1 | 6/2006 | Maaskant et al. |
| 2006/0186420 A1 | 8/2006 | Hirukawa et al. |
| 2011/0297914 A1 | 12/2011 | Zheng et al. |
| 2014/0166975 A1 | 6/2014 | Ito |
| 2014/0267683 A1 | 9/2014 | Bibl |
| 2015/0155261 A1 | 6/2015 | Uhm et al. |
| 2015/0311415 A1 | 10/2015 | Song et al. |
| 2016/0315218 A1* | 10/2016 | Bour ....................... H01L 33/06 |
| 2017/0069804 A1* | 3/2017 | Lin ..................... H01L 33/0095 |
| 2017/0142874 A1 | 5/2017 | Pourchet et al. |
| 2017/0215280 A1* | 7/2017 | Chaji ...................... H01L 24/95 |
| 2017/0271557 A1 | 9/2017 | Brennan et al. |
| 2017/0338374 A1* | 11/2017 | Zou ......................... H01L 33/44 |
| 2018/0006083 A1* | 1/2018 | Zhu .................... H01L 33/0095 |
| 2018/0261582 A1* | 9/2018 | Henry ................ H01L 33/0095 |
| 2018/0277524 A1 | 9/2018 | Moon et al. |
| 2019/0051637 A1* | 2/2019 | Lo ........................... H01L 33/62 |
| 2019/0051792 A1* | 2/2019 | Lo ....................... H01L 33/0093 |
| 2019/0088821 A1 | 3/2019 | Oike et al. |
| 2019/0139794 A1* | 5/2019 | Saketi ............... H01L 21/67144 |
| 2020/0128708 A1 | 4/2020 | Saketi |
| 2020/0303585 A1* | 9/2020 | Lo ......................... H01L 25/167 |

OTHER PUBLICATIONS

U.S. Appl. No. 16/600,896, "Final Office Action", dated Mar. 3, 2021, 15 pages.

U.S. Appl. No. 16/600,896, "Non-Final Office Action", dated Oct. 28, 2020, 11 pages.

U.S. Appl. No. 16/595,948, "Corrected Notice of Allowability", dated Jul. 23, 2021, 7 pages.

U.S. Appl. No. 16/595,948, "Notice of Allowance", dated Jun. 16, 2021, 10 pages.

U.S. Appl. No. 16/600,896, "Notice of Allowance", dated Jun. 23, 2021, 8 pages.

* cited by examiner

LIGHT EMITTING DIODES MANUFACTURE AND ASSEMBLY

CROSS-REFERENCE TO RELATED APPLICATIONS

This application claims the benefit of U.S. Provisional Application No. 62/747,460, filed Oct. 18, 2018, entitled "Light Emitting Diodes Manufacture and Assembly" which is incorporated herein by reference in its entirety.

BACKGROUND

The disclosure relates generally to display technologies, and more specifically to the assembly of light emitting diodes.

Displays are ubiquitous and are a core component of wearable devices, smart phones, tablets, laptops, desktops, TVs and display systems. Common display technologies today range from Liquid Crystal Displays (LCDs) to Light Emitting Diode (LED) displays. A display can be created by assembling an array of LCD or LED display elements. The processes used for fabrication and assembly of the array of display elements can be a factor in determining the speed and the yield of the display manufacturing process.

SUMMARY

The present disclosure relates to display technologies. More specifically, and without limitation, this disclosure relates to a method of manufacturing a set of LED devices and assembling the LED devices to form a display. The method may include using one or more carrier devices to transfer the LED devices from a substrate to a backplane (e.g., a display backplane). The method may include forming an epitaxial layer on a substrate, the epitaxial layer having a first surface that interfaces with the substrate and a second surface opposite to the first surface. The epitaxial layer may include a quantum well layer to generate light.

In a case where the epitaxial layer is closer to the first surface (and the substrate) than to the second surface, a single carrier device can be used to transfer and assemble the LED devices on a backplane. The method further includes forming an adhesive layer between the second surface of the epitaxial layer and a surface of the single carrier device to adhere the epitaxial layer to the single carrier device (or vice versa), etching away the substrate, and then etching away the second surface of the epitaxial layer to form a set of LED devices. The method further includes forming a bonding layer between a subset of the LED devices and a surface of a backplane (e.g., a display backplane) to bond the subset of the LED devices with the backplane. A subset of the LED devices (formed on the first surface) can then be selectively bonded with the backplane via the second bonding layer. Thereafter, the single carrier device can be moved away from the backplane to leave the subset of the LED devices on the backplane. The subset of the LED devices are thereby transferred to the backplane.

On the other hand, in a case where the epitaxial layer is closer to the second surface than to the first surface, two carrier devices can be used to transfer and assemble the LED devices on the device backplane. A first carrier device can be adhered to the second surface via a first adhesive layer, as discussed above. The substrate can then be etched away to expose the first surface of the epitaxial layer. A second adhesive layer can be formed between the first surface and a second carrier device. The first carrier device (and the first adhesive layer) can then be removed from the epitaxial layer to expose the second surface, and the LED devices can be formed by etching the exposed second surface. A subset of the LED devices (formed on the second surface in this case) can then be selectively bonded with the backplane via the second bonding layer as discussed above. Thereafter, the second carrier device can be moved away from the device backplane to leave the subset of the LED devices on the backplane. The subset of the LED devices are thereby transferred to the backplane.

In one example, a method for manufacturing LED devices is provided. The method comprises forming an epitaxial layer on a starter substrate, the epitaxial layer having a first surface that interfaces with the starter substrate and a second surface opposite to the first surface; establishing an adhesive bond between the second surface of the epitaxial layer and a carrier substrate having a pre-determined light transmittance; etching away the starter substrate; etching away part of the epitaxial layer to form a plurality of light emitting diode (LED) dies on a third surface of the epitaxial layer opposite to the second surface; establishing one or more conductive bonds between selected one or more LED dies, from the plurality of LED dies, and a backplane; using a light directed through the carrier substrate to weaken the adhesive bond between the second surface of the epitaxial layer and the carrier substrate; and moving the carrier substrate away from the backplane while the selected one or more LED dies remains conductively bonded with the backplane, to transfer the selected one or more LED dies to the backplane.

In some aspects, the epitaxial layer further includes a quantum well layer to generate light. The quantum well layer can be positioned closer to the first surface than to the second surface.

In some aspects, the starter substrate is opaque. The starter substrate may include Gallium Arsenide material. In some aspects, the carrier substrate is transparent and may include glass.

In some aspects, establishing the adhesive bond between the second surface of the epitaxial layer and the carrier substrate comprises forming an adhesive layer comprises at least one of: a polymer, a glue, or wax. Laser light can be directed through the carrier substrate to melt the adhesive layer to weaken the adhesive bond.

In some aspects, the method further comprises forming device-side bumps on the plurality of LED dies; forming backplane-side bumps on at least one of one or more pre-determined locations on the backplane, the at least one of one or more pre-determined locations corresponding to the selected one or more LED dies; and establishing the one or more conductive bonds between the device-side bumps on the selected one or more LED dies and the backplane-side bumps on the backplane. In some aspects, the method further comprises heating the device-side bumps and the backplane-side bumps to a pre-determined temperature to form the one or more conductive bonds between the device-side bumps on the selected one or more LED dies and the backplane-side bumps on the backplane.

In some aspects, the backplane is a first backplane. The selected one or more LED dies can be first selected one or more LED dies. The one or more conductive bonds can be first one or more conductive bonds. The method further comprises: moving, using a pick up tool (PUT), the carrier substrate towards the first backplane to establish the first one or more conductive bonds between the first selected one or more LED dies and the first backplane; moving, using the PUT, the carrier substrate away from the first backplane to transfer the first selected one or more LED dies to the first backplane; moving, using the PUT, the carrier substrate towards a second backplane to establish second one or more conductive bonds between second selected one or more LED dies and the second backplane; and moving, using the PUT, the carrier substrate away from second backplane to transfer the second selected one or more LED dies to the second backplane.

In some aspects, the method further comprises: applying a signal to each of the plurality of LED dies to control each of the plurality of LED dies to emit light; collecting, using a light sensor array and via the carrier substrate, light emitted by one or more LEDs of the plurality of LED dies in response to the signal; and selecting, based on an output of the light sensor array and from the plurality of LED dies, the one or more LED dies to establish the one or more conductive bonds with the backplane.

In some aspects, the backplane comprises a thin film transistor (TFT) backplane. The third surface may comprise the first surface.

In one example, a method for manufacturing LED devices is provided. The method comprises: forming an epitaxial layer on a starter substrate, the epitaxial layer having a first surface that interfaces with the starter substrate and a second surface opposite to the first surface; establishing a first adhesive bond between the second surface of the epitaxial layer and a first carrier substrate having a pre-determined light transmittance; etching away the starter substrate; establishing a second adhesive bond between a second carrier substrate and a third surface of the epitaxial layer opposite to the second surface of the epitaxial layer, the second carrier substrate having a pre-determined light transmittance; using a light directed through the first carrier substrate to weaken the first adhesive bond between the second surface of the epitaxial layer and the first carrier substrate; moving the first carrier substrate away from the second surface of the epitaxial layer; etching away part of the epitaxial layer to form a plurality of light emitting diode (LED) dies on the third surface of the epitaxial layer; establishing one or more conductive bonds between selected one or more LED dies, from the plurality of LED dies, and a backplane; using a light directed through the second carrier substrate to weaken the second adhesive bond between the third surface of the epitaxial layer and the second carrier substrate; and moving the second carrier substrate away from the backplane while the selected one or more LED dies remains conductively bonded with the backplane, to transfer the selected one or more LED dies to the backplane.

In some aspects, the epitaxial layer further includes a quantum well layer to generate light. The quantum well layer is positioned closer to the second surface than to the first surface.

In some aspects, the starter substrate includes Gallium Arsenide material.

In some aspects, the first carrier substrate and the second carrier substrate include glass.

In some aspects, establishing the first adhesive bond between the second surface of the epitaxial layer and the first carrier substrate comprises forming a first adhesive layer comprising at least one of: a polymer, a glue, or wax. Establishing the second adhesive bond between the second carrier substrate and the third surface of the epitaxial layer comprises forming a second adhesive layer comprising at least one of: a polymer, a glue, or wax.

In some aspects, a laser light is directed through the first carrier substrate to melt the first adhesive layer to weaken the first adhesive bond. The laser light is directed through the second carrier substrate to melt the second adhesive layer to weaken the second adhesive bond.

In some aspects, the third surface comprises the first surface.

BRIEF DESCRIPTION OF THE DRAWINGS

Illustrative embodiments are described with reference to the following figures.

Figure 1:
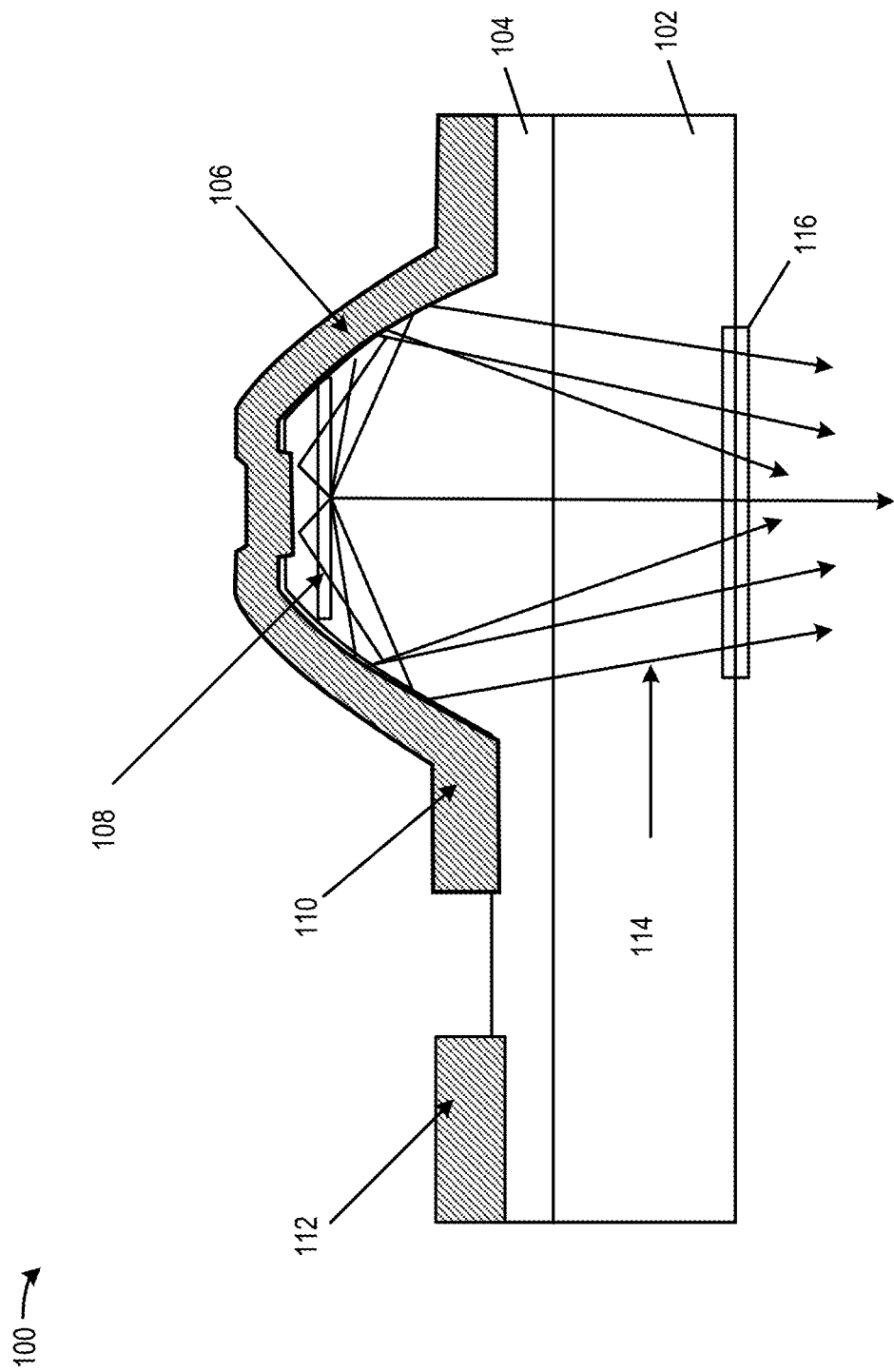
FIG. 1 shows a cross-sectional view of an example LED device that can be manufactured using examples of the disclosed techniques.

The figures depict examples of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Common display technologies today range from Liquid Crystal Displays (LCDs) to more recent Organic Light Emitting Diode (OLED) displays and Active Matrix Organic Light Emitting Diode (AMOLED) displays. Inorganic Light Emitting Diodes (ILEDs) are emerging as the third generation of flat display image generators based on superior battery performance and enhanced brightness. A "µLED," or "MicroLED," described herein refers to a particular type of ILED having a small active light emitting area (e.g., less than 2,000 µm$^2$) and, in some examples, being capable of generating directional light to increase the brightness level of light emitted from the small active light emitting area. In some examples, a micro-LED may refer to an LED that has an active light emitting area that is less than 50 µm, less than 20 µm, or less than 10 µm. In some examples, the linear dimension may be as small as 2 µm or 4 µm.

ILED displays can be manufactured using different processes from OLED displays. For example, OLED devices are fabricated directly onto a backplane (e.g., a display backplane). In contrast, ILED devices are fabricated separately from the backplane. The base material of ILED devices base material is grown on a crystalline substrate to form an LED starter wafer. The LED starter wafer can be processed through various steps to produce individual LED dies, with each LED die including an LED device. Once fabricated, the LED dies can be transferred from the carrier substrate to a backplane. The backplane can be a backplane, which may include a flexible substrate such as polymers, or a rigid substrate such as Thin Film Transistor (TFT) glass substrate. As part of the transfer process, the LED dies can also be assembled to form a display element which corresponds to a pixel or a sub-pixel of a display. A final display may comprise one or more display elements.

The process of assembling (or manufacturing) a display element by transferring LED dies from a carrier substrate to a backplane may include the use of a Pick Up Tool (PUT) configured to pick up LED dies from the carrier substrate, transfer them to the backplane and place them on the backplane, a process termed "pick-and-place." The PUT can pick up an LED die from the carrier substrate by applying an attractive force, hold the LED die in place until the force is reduced to release the die, and remove or reverse the force of attraction to eject the LED die to the backplane. A challenge associated with the use of the PUT is the ability to control the forces adhering and releasing the dies at small scales to, for example, provide uniform forces for adhering and releasing each LED die.

It is advantageous to perform parallel transfer of multiple LED dies onto the backplane, rather than picking up and placing each LED die sequentially, to speed up the manufacture process of the display. Moreover, it is also advantageous to perform selective parallel transfer of a subset of LED dies to the backplane. For example, the LED dies can be tested when they are still on the starter wafer substrate, and only the LED dies that are tested to be non-defective can be transferred to the backplane, while leaving behind the defective LED dies on the starter wafer substrate.

Conventional PUT techniques are not suitable for performing selective parallel pick up and transfer of multiple LED dies. For example, conventional PUT can pick up and release the die using various kinds of forces including, for example, air pressure (e.g., by generating airflow), Van Der Waals force (e.g., using conformal transfer heads), capacitive force, etc. A challenge associated with the use of the PUT is the ability to control the forces adhering and releasing the LED dies at small scales. It can also be difficult to scale the forces of a PUT to allow for parallel pick up and placement of a large number of small LED dies. For example, imperfection of various components of the PUT can introduce errors in the forces provided by the PUT, which can lead to non-uniformity in the forces applied by the PUT to each LED die. The non-uniformity in the applied forces (e.g., for adhering and/or releasing each LED die) can lead to, for example, failure in transferring LED dies onto the backplane, which reduces the manufacture yield of the displays. Moreover, some of the conventional PUT techniques, such as the use of Van Der Waals force, do not support individually switchable forces for each individual LED dies and may not allow selective pick up and transfer of multiple LED dies.

This disclosure relates to a method of manufacturing a set of LED devices, such as ILED devices, and assembling the LED dies to form a display. The method may include forming an epitaxial layer on a starter substrate, the epitaxial layer having a first surface that interfaces with the starter substrate and a second surface opposite to the first surface. In a case where the epitaxial layer is closer to the first surface (and the substrate) than to the second surface, a single carrier substrate can be used to transfer and assemble the LED devices on a backplane such as a backplane. The method further includes forming an adhesive layer between the second surface of the epitaxial layer and a surface of the single carrier substrate to adhere the epitaxial layer to the single carrier substrate, etching away the starter substrate, and then etching away the first surface of the epitaxial layer to form multiple LED dies. The method further includes forming a conductive bonding layer between a subset of the multiple LED devices and the backplane to bond the subset of the LED devices with the backplane. Device-side bumps can be formed on each of the multiple LED dies to provide the bonding layer. A subset of the multiple LED dies (formed on the first surface) can then be selectively bonded with the backplane via the bumps. The selective bonding can be performed by, for example, forming backplane-side bumps at pre-determined locations of the backplane that correspond with the subset of the multiple LED dies, and forming conductive bonds between the device-side bumps of the subset of the multiple LED devices and the corresponding backplane-side bumps on the backplane. Thereafter, the single carrier device can be moved away by a PUT to leave the subset of the multiple LED dies on the backplane.

On the other hand, in a case where the epitaxial layer is closer to the second surface than to the first surface, two carrier substrates can be used to transfer and assemble the LED devices on the backplane. A first carrier substrate can be adhered to the second surface via a first adhesive layer, as discussed above. The starter substrate can then be etched away to expose the first surface of the epitaxial layer. A second adhesive layer can be formed between the exposed first surface and a second carrier substrate. The first carrier substrate (and the first bonding layer) can then be removed from the epitaxial layer to expose the second surface, and the LED dies can be formed by etching the exposed second surface. A subset of the multiple LED dies (formed on the second surface in this case) can then be selectively bonded with the backplane as discussed above. Thereafter, the second carrier device can be moved away by a PUT to leave the subset of the multiple LED dies on the backplane.

The disclosed techniques enable parallel transfer of multiple LED dies to one or more backplanes (e.g., a display backplane, or other types of backplanes) by directly bonding LED dies with the backplane. Compared with conventional techniques where a PUT manipulates individual LED dies, the disclosed techniques enables a PUT to manipulate the carrier substrate to transfer multiple LED dies simultaneously. Moreover, multiple LED dies can be bonded with multiple backplanes after a single pick up of the LED dies by the PUT. For example, the PUT can pick up a carrier substrate with multiple LED dies, and then transfer subsets of the multiple LED dies to each of multiple backplanes. Each backplane can have bumps formed at pre-determined locations to receive (and bond with) a pre-determined subset of the multiple LED dies from the carrier substrate. All these can substantially speed up the transfer of the LED dies to the backplanes and improve the manufacture efficiency of the displays.

Moreover, the disclosed techniques can relax the control of forces applied by the PUT. For example, contrary to the conventional techniques which may require modulating the forces applied by the PUT onto a small LED die at different stages to pick up and then release the LED die, with the disclosed techniques the PUT can apply a force on a much larger carrier substrate to move the carrier substrate away to disconnect the selected LED dies from the carrier substrate to perform the transfer. All these can relax the required precisions for the applied forces, which in turn can improve the manufacture yield of the displays. Further, the disclosed techniques also enable selective transfer of LED dies by, for example, selectively forming bumps on a subset of LED dies. The selective transfer allows measures to be taken to prevent putting defective LED dies onto the backplane, which can further improve the manufacture yield of the displays.

In some examples, the disclosed techniques can use transparent (or at least non-opaque) carrier substrates (e.g., glass substrates) to perform transfer of LED dies. The use of transparent carrier substrates enable additional processing to be performed on LED dies that are fabricated on a starter substrate that is opaque (or having very low light transmittance), such as red LED dies fabricated on Gallium Arsenide (GaAs) substrates. The additional processing can facilitate the transfer of LED dies and to improve the manufacture yield of the displays. For example, as discussed above, the carrier substrate can be moved away (e.g., by a PUT) from the backplane to disconnect the LED dies from the carrier substrate. Prior to moving the carrier substrate, a laser lift-off (LLO) process can be performed in which laser lights can be projected through the transparent carrier substrate onto the interface between the LED dies and the carrier substrate. The laser lights can be used to weaken the bonding between the LED dies and the carrier substrate to facilitate the disconnection of the LED dies from the carrier substrate. Moreover, the transparent carrier substrate also allows the LED dies to be tested for defects prior to transferring them to the backplane. For example, prior to forming second bonding layer between the LED dies and the backplane, the LED dies can be tested (e.g., by applying electrical signals), and light emitted by each LED die under test can travel through the transparent carrier substrate and be collected by testing equipment. Based on the light collected for each LED die, it can be determined which of the LED dies are defective, and only the non-defective LED dies can be selected to form the second bonding layer with the backplane for subsequent transfer. The disclosed techniques enable the fabrication of LED dies on opaque starter wafer substrates (e.g., red LEDs fabricated on Gallium Arsenide (GaAs) substrates) to use the LLO processes and early testing of defects to improve manufacture efficiency and yield of the displays.

Examples of the present disclosure may include, or be implemented in conjunction with, an artificial reality system. artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers. Examples of the present disclosure may be used to implement, for example, a display system in a HMD, a mobile device, a computing system, or any other hardware platform capable of providing artificial reality content to one or more viewers.

FIG. 1 shows a cross-sectional view of a μLED 100 according to some examples of the present disclosure. As shown in FIG. 1, μLED 100 includes, among others, a substrate 102, a semiconductor epitaxial layer 104 disposed on the substrate 102. Epitaxial layer 104 can be shaped into a mesa 106. An active layer 108, which can include quantum well structures configured to emit light of a pre-determined wavelength range when activated, can be included in mesa 106. Mesa 106 has a truncated top covered by a P-type contact pad 110, whereas a part of epitaxial layer 104 outside of mesa 106 may be covered by an N-type contact pad 112. An electric signal can be applied across P-type contact pad 110 and N-type contact pad 112 to activate active layer 108 to emit light 114. Mesa 106 also has a near-parabolic shape to form a reflective enclosure. The near-parabolic structure of mesa 106 can be etched directly onto the LED die during the wafer processing steps. Light 114 emitted from active layer 108 can be reflected off the internal walls of mesa 106 toward light emitting surface 116 at an angle sufficient for the light to escape the μLED die 100 (i.e., within an angle of total internal reflection). Light 114 can form a quasi-collimated light beam as the light emerges from light emitting surface 116.

Figure 2A:
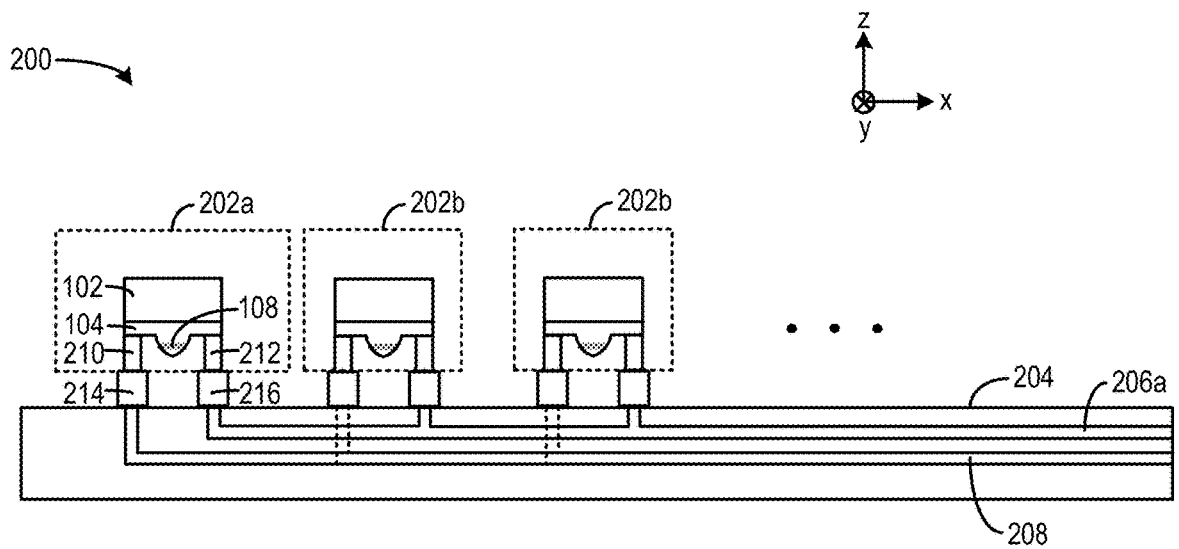
FIG. 2A and FIG. 2B are schematic views of an example display that can be manufactured using examples of the disclosed techniques.
Figure 2B:
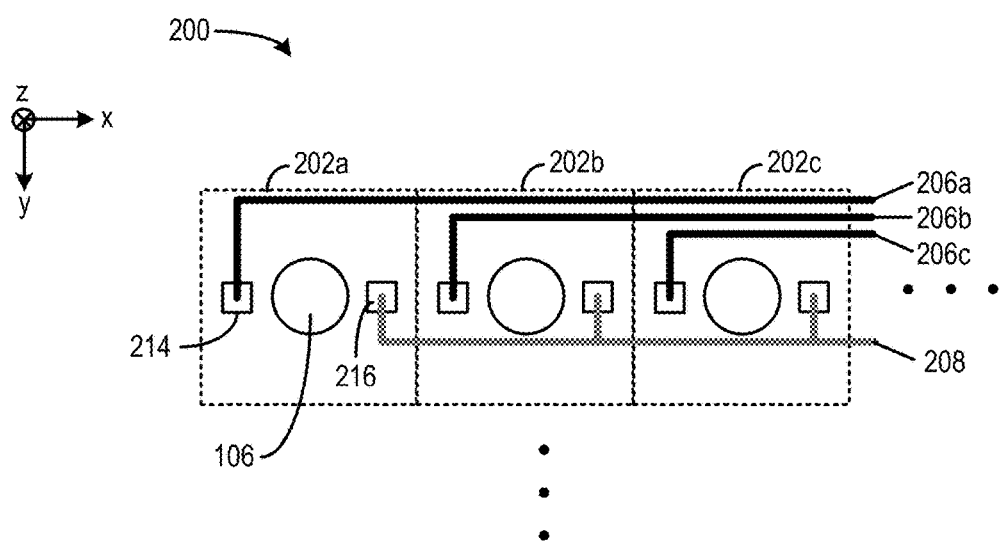

FIG. 2A and FIG. 2B show an example of a μLED display apparatus 200 according to some examples of the present disclosure. FIG. 2A shows a cross-sectional view of the display apparatus, whereas FIG. 2B shows a top view of the display apparatus. As shown in FIG. 2A, μLED display 200 can include an array of μLED dies 202 including, for example, μLED die 202a, μLED die 202b, and μLED die 202c assembled on a backplane 204. In the example of FIG. 2A, the array of μLED dies 202 may correspond to one display element, with μLED die 202a configured to generate blue light, μLED die 202b configured to generate red light, and μLED die 202c configured to generate green light. In some examples, the array of μLED dies 202 may be part of a μLED strip for producing a particular color, and each of μLED dies 202a, 202b, and 202c can be configured to generate blue light, green light, red light, etc.

Backplane 204 may include a structure for attaching a plurality of μLED dies, to provide structural support of a μLED device assembly. As used herein, "backplane" may refer to any structure that provides a surface (which can be planar, curved, etc.) for attaching a plurality of LED devices (which may include μLED devices as described in this disclosure) and for providing electrical signals to the plurality of LED devices. The backplane can be configured as a display backplane to form a display device. For example, the backplane can hold assemblies of LED devices forming display elements, and the backplane may also include traces to provide electrical signals to the LED devices to control the information displayed by the display elements. Backplane 204 may comprise traces, which may connect to other components. Backplane may also comprise electrical contact points, e.g., metal pads, which may provide access to the traces. For example, as shown in FIG. 2A and FIG. 2B, backplane 204 includes electrical traces 206a, 206b, and 206c to couple with, respectively, μLED die 202a, μLED die 202b, and μLED die 202c. Electrical traces 206a, 206b, and 206c allow each of μLED die 202a, μLED die 202b, and μLED die 202c to be individually controlled by applying different signals. Backplane 204 also includes an electrical trace 208 to act as a return current path for each of μLED die 202a, μLED die 202b, and μLED die 202c. Backplane 204 may include different kinds of materials, such as Thin Film Transistor (TFT) glass substrate, polymer, polychlorinated biphenyl (PCB), etc. Although FIG. 2A illustrates that backplane 204 has a rectangular shape, it is understood that backplane 204 can have various shapes and sizes.

Each of μLED die 202a, μLED die 202b, and μLED die 202c can have similar structure as μLED die 100 of FIG. 1. Each μLED die in FIG. 2A and FIG. 2B may include substrate 102, epitaxial layer 104, mesa 106, and active layer 108. In addition, each μLED die includes a device-side bump 210 and a device-side bump 212. While FIG. 2A and FIG. 2B illustrate that the bumps are of rectangular shape, it is understood that the bumps can take on other shapes including, for example, rounded shapes, dome shapes, etc. Device-side bump 210 can be connected to P-type contact pad 110 (not shown in FIG. 2A and FIG. 2B), whereas device-side bump 212 can be connected to N-type contact pad 112 (also not shown in FIG. 2A and FIG. 2B). Moreover, backplane 204 includes backplane-side bumps at each location for placing a μLED die. For example, backplane 204 includes backplane-side bumps 214 and 216 for μLED die 202a. Backplane 204 also includes metal pads (not shown in FIG. 2A) which serve as a foundation on which backplane-side bumps 214 and 216 are deposited, and to provide electrical contact to traces 206 and 208. Conductive bonding (e.g., metallic bonding) can be formed between the bumps of the μLED dies and the contacts to provide electrical paths between the μLED die and backplane 204.

Figure 3A:
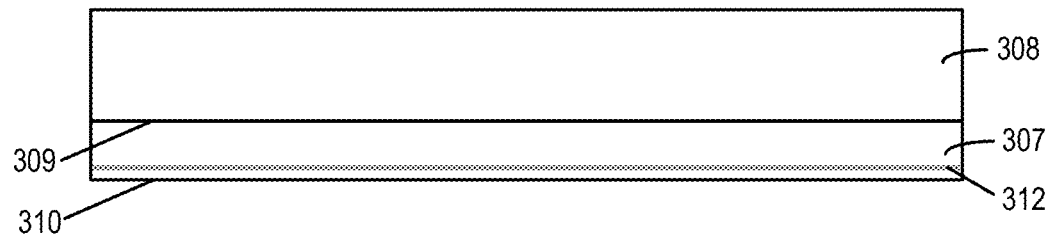
FIG. 3A and FIG. 3B illustrate an example process of manufacturing and assembling LED devices.
Figure 3A:
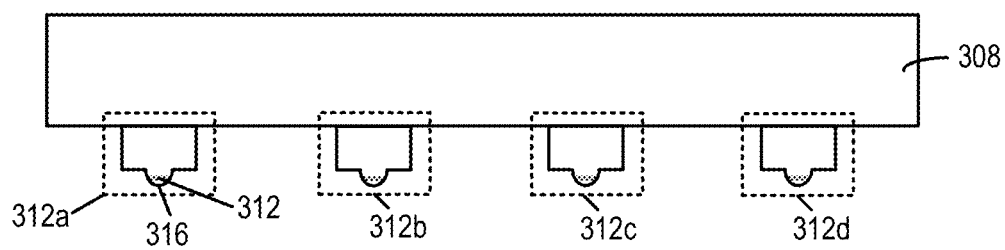
Figure 3A:
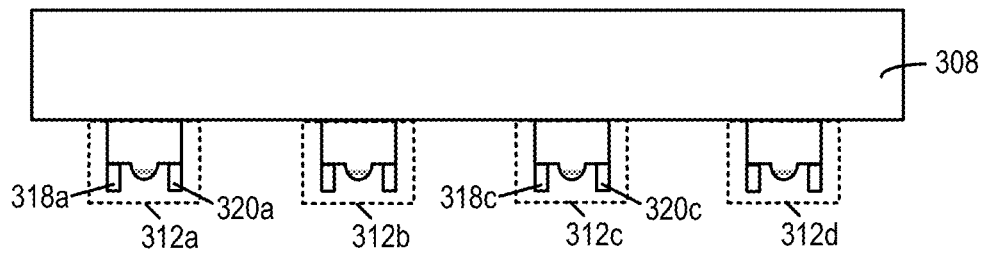
Figure 3B:
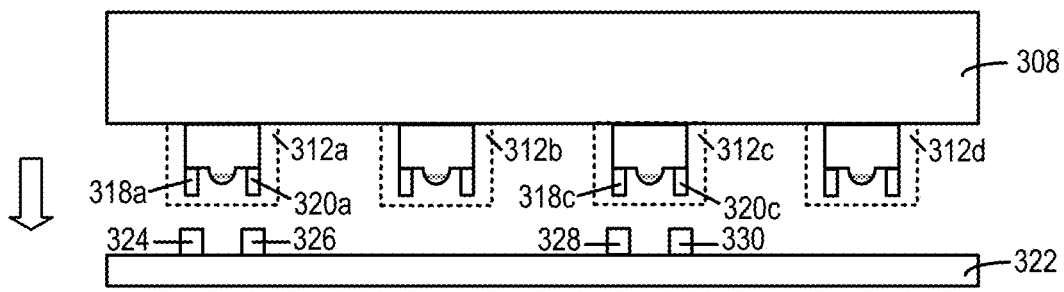
Figure 3B:
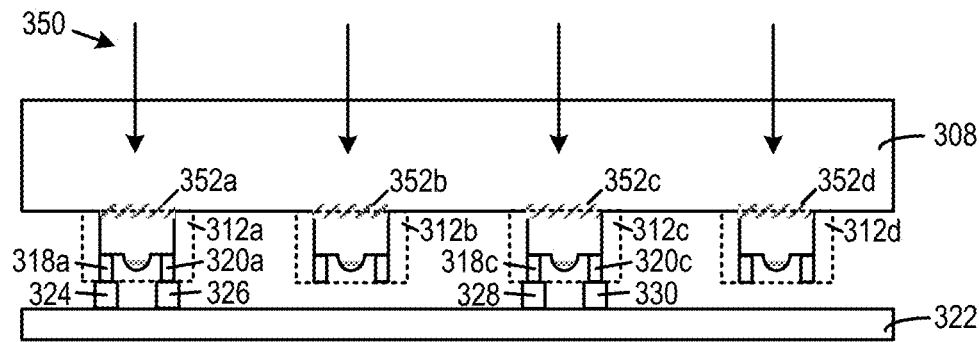
Figure 3B:
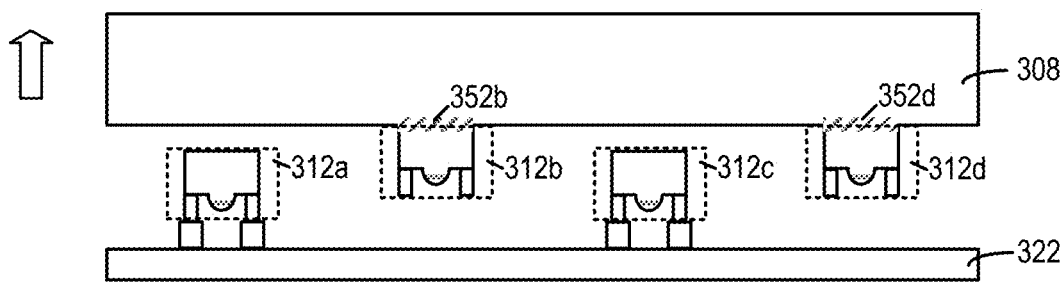

FIG. 3A and FIG. 3B illustrate an example of a process 300 for manufacturing and assembling an array of LED devices on a backplane, according to some examples. Process 300 can be used to manufacture and assemble, for example, the array of μLED dies 202 on backplane 204. In FIG. 3A and FIG. 3B, the cross-sectional view of devices involved in process 300 is shown. Process 300 starts with step 301, in which an epitaxial layer 307 is grown on a crystalline substrate 308. Crystalline substrate 308 may be, for example, a transparent sapphire substrate. Epitaxial layer 307 may include Gallium Nitride (GaN) material. Epitaxial layer 307 includes a first surface 309 that interfaces with crystalline substrate 308, and a second surface 310. Epitaxial layer 307 further includes a light emitting layer 312 which can include quantum wells to generate light when activated.

In step 302, part of second surface 310 of epitaxial layer 307 can be etched away to form a set of μLED dies 314a, 314b, 314c, and 314d. Each μLED die may include a mesa 316 and part of light emitting layer 312. The etching can be performed using, for example, wet etching and dry etching. Examples of dry etching may include, for example, deep reactive-ion etching (DRIE) inductively coupled plasma (ICP) etching, etc. P and N contacts (not shown in FIG. 3A and FIG. 3B) are also formed on each μLED die.

In step 303, device-side bumps 318 and 320 can be formed on each of μLED dies 314a, 314b, 314c, and 314d. For example, μLED die 314a has device-side bumps 318a and 320a, whereas μLED die 314c has device-side bumps 318c and 320c. Device-side bumps 318 and 320 can be electrically coupled with the P and N contacts and may include, for example, Copper, Gold, conductive B-stage epoxies, or other suitable metals for carrying signals to activate light emitting layer 312.

Referring to FIG. 3B, in step 304, crystalline substrate 308, together with μLED dies 314a, 314b, 314c, and 314d, can be picked up by a PUT and brought towards a backplane 322. Backplane 322 may include, for example, backplane 204. Backplane 204 may include backplane-side bumps 324, 326, 328, and 330 for providing electrical paths to the contacts of the embedded traces, as described above. The backplane-side bumps can be formed at positions corresponding to μLED dies 314a and 314c, but not at positions corresponding to μLED dies 314b and 314d. As crystalline substrate 308 is brought towards backplane 322, device-side bumps 318a and 320a of μLED die 314a and backplane-side bumps 324 and 326 may become sufficiently close (or in contact) to enable formation of conductive bonding between the two sets of bumps. Moreover, device-side bumps 318c and 320c of μLED die 314c and backplane-side bumps 328 and 330 may also become sufficiently close (or in contact) to enable formation of conductive bonding between the two sets of bumps. The conductive bonds between the device-side bumps and the backplane-side bumps can create an electrical path between the μLED dies and traces embedded in backplane 204. The electrical path enables transmission of control signals and electric currents to the μLED devices.

With the arrangements of steps 304, selective and parallel bonding of μLED dies 314a and 314c (but not μLED dies 314b and 314d) with backplane 322 can be performed. The parallel bonding enables simultaneous transfer of a large number of μLED dies to backplane 322, which can substantially increase the speed of transferring the μLED dies to the backplane (e.g., compared with picking up and releasing individual μLED die sequentially), which in turn speeds up the manufacture of the displays. Moreover, with selective bonding, defective LED dies can be prevented from being transferred to the backplane, which can further improve the manufacture yield of the displays.

In both steps 303 and 304, the device-side and backplane-side bumps can be formed by, for example, electroplating, solder deposition, electroless plating techniques, screen printing, inkjet deposition, lithography, evaporation, laser based deposition techniques, elf-assembly, transfer-printing, etc. The bonding can be formed by, for example, irradiation with UV light, application of heat and/or pressure. For example, the bumps can be metallic, and the application of heat and/or pressure can partially melt the bumps to form metallic bonds at the junction between the contacts and bumps. Moreover, in a case where the bumps are made of conductive B-stage epoxy, permanent bonding can also be formed between bumps by, for example, curing under a pre-determined temperature (e.g., typically 200-300° C.) and/or by UV light irradiation.

In step 305, crystalline substrate 308 can be held in a position where device-side bumps 318a and 320a of μLED die 314a are in contact with and bonded with, respectively, backplane-side bumps 324 and 326, and where device-side bumps 318c and 320c of μLED die 314c are in contact with and bonded with respectively backplane-side bumps 328 and 330. A laser lift-off (LLO) process may be used to weaken the bonding between crystalline substrate 308 and each of μLED dies 314a, 314b, 314c, and 314d at, respectively, interfaces 352a, 352b, 352c, and 352d. For example, as part of the LLO process, laser light 350 can be projected through crystalline substrate 308 to melt some of the GaN material at interfaces 352a, 352b, 352c, and 352d. In some examples, in addition to (or in lieu of) LLO, heat can also be applied to crystalline substrate 308 to weaken the bonding at interfaces 352a, 352b, 352c, and 352d. μLED dies 314a, 314b, 314c, and 314d can block off laser light 350 to prevent the laser beams from melting the bumps and contacts and weakening the bonding between backplane 322 and μLED dies 314a and 314c.

In step 306, crystalline substrate 308 can be move away from backplane 322 by the PUT. As crystalline substrate 308 is moved away, μLED dies 314a and 314c can be disconnected from crystalline substrate 308 due to the weakened bonding at interfaces 352a and 352c. μLED dies 314a and 314c may then remain bonded with backplane 322. On the other hand, μLED dies 314b and 314d are not bonded with backplane 322 and may move away together with crystalline substrate 308.

Figure 4:
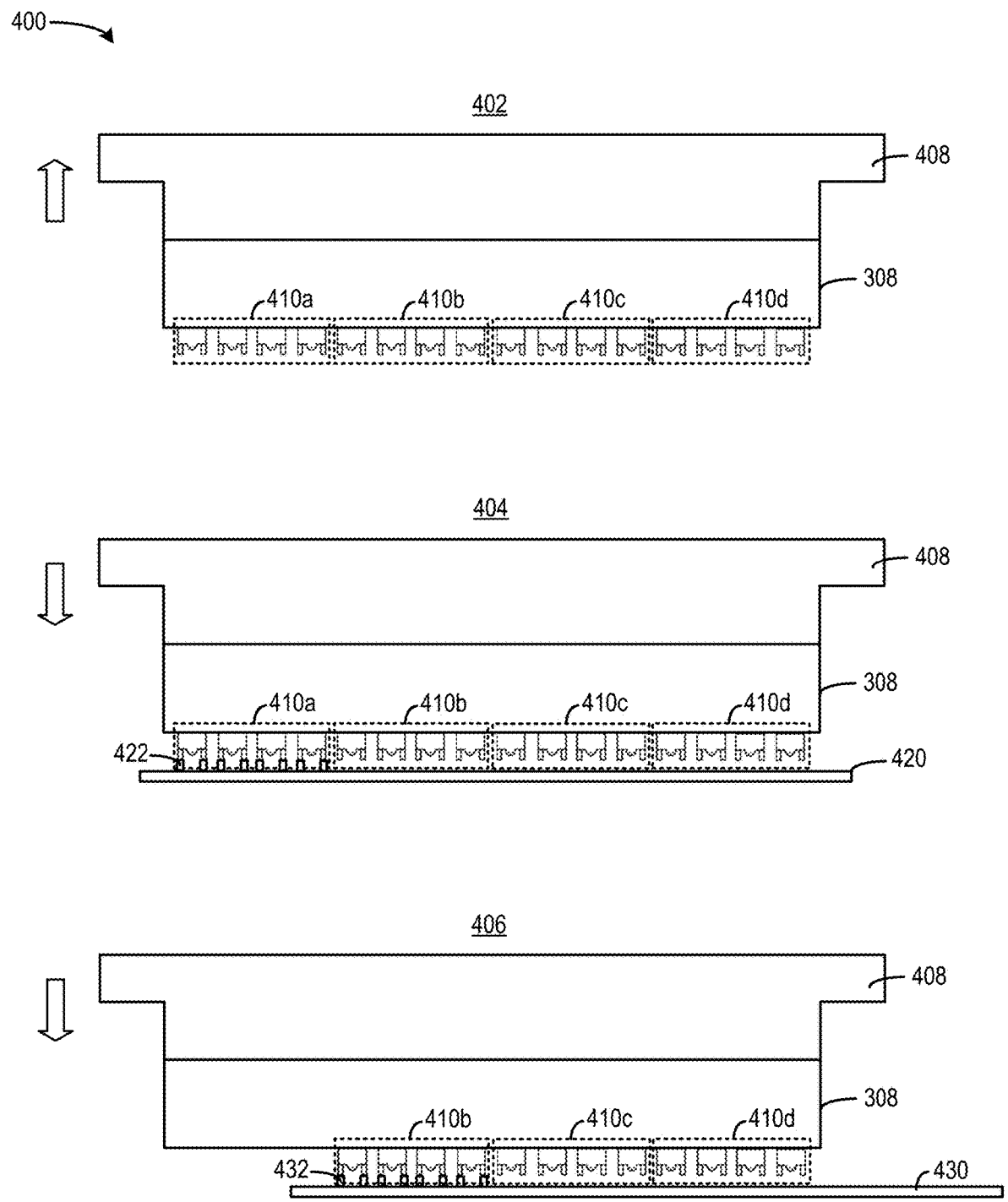
FIG. 4 illustrates an example process of transferring LED dies to multiple backplanes.

Process 300 of FIG. 3A and FIG. 3B can also be extended to selective transfer of subsets of μLED dies to multiple display planes after a single pick up of substrate 308 by the PUT. Although FIG. 4 illustrates an example of process 400 for transferring μLED dies, it is understood that process 400 is applicable for transfer of other types of LED devices. In step 402, a PUT 408 picks up crystalline substrate 308 with μLED die groups 410a, 410b, 410c, and 410d.

In step 404, PUT 408 brings crystalline substrate 308 towards backplane 420. Backplane 420 has backplane-side bumps (e.g., bump 422) formed at pre-determined locations (e.g., near an edge of backplane 420) to bond with μLED die groups 410a. As part of step 402, at least one of crystalline substrate 308 or backplane 420 can be subject to heat to facilitate formation of bonding between the device-side bumps of μLED die groups 410a and the backplane-side bumps of backplane 420. Moreover, laser light (not shown in FIG. 4) can be projected via crystalline substrate 308 as part of the LLO process to weaken the bonding between μLED die groups 410a (and other die groups) and substrate 308. PUT 408 then moves substrate 308 away from backplane 420, which causes μLED die group 410a to detach from substrate 308 and to remain bonded with backplane 420.

In step 406, PUT 408 brings crystalline substrate 308 towards backplane 430. Backplane 430 has backplane-side bumps (e.g., bump 432) formed at pre-determined locations (e.g., near an edge of backplane 430) to bond with μLED die groups 410b. Backplane 430 is also shifted with respect to backplane 420 to align the backplane-side bumps with the device-side bumps of μLED die groups 410b. The LLO process can also be applied, following which PUT 408 can move substrate 308 away from backplane 430 to detach μLED die groups 410b from substrate 308. Step 406 (or 404) can then be repeated for other μLED die groups.

With the arrangements of process 400, a PUT can perform a single pick up of multiple μLED dies, and then transfer subsets of the μLED dies to different display planes, which is substantially faster than, for example, operating the PUT to pick up and place each μLED die individually and sequentially onto each backplane.

Figure 5:
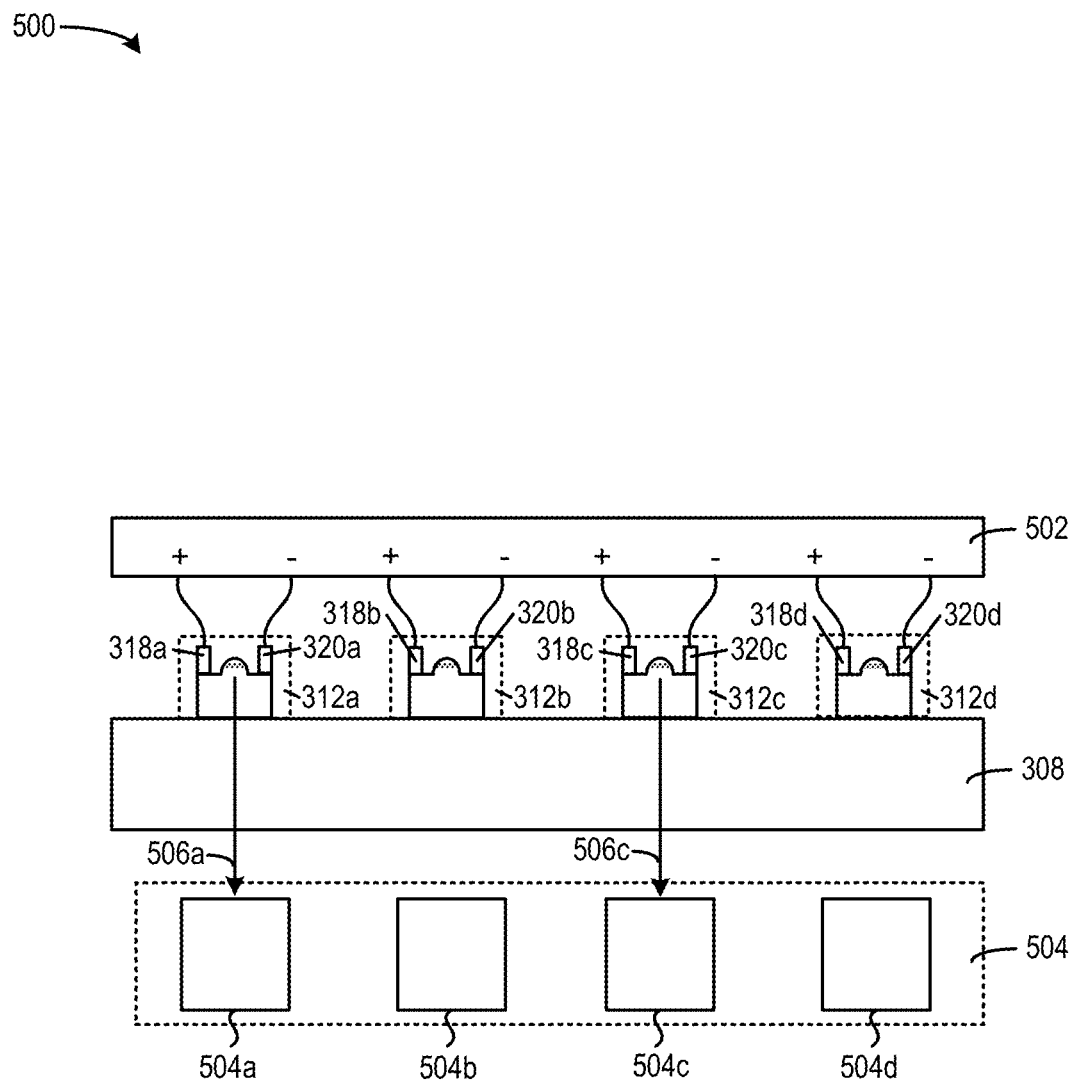
FIG. 5 illustrates an example system for testing LED devices.

FIG. 5 is a schematics illustrating an example testing system 500 for performing testing of LED dies, such as μLED dies 314a, 314b, 314c, and 314d, or other types of LED devices/dies. Testing system 500 can be used to test μLED dies 314a, 314b, 314c, and 314d to provide information for subsequent selective transfer of the μLED dies to the backplane. The testing can be performed when the μLED dies are still on crystalline substrate 308 and bumps have been formed on the μLED dies (e.g., in step 303 of FIG. 3A), and before the μLED dies are transferred to backplane 322 (e.g., in step 305 of FIG. 3B). The testing can be performed to determine which of μLED dies 314a, 314b, 314c, and 314d is defective, and the defective μLED dies can be de-selected from being transferred to backplane 322, whereas non-defective μLED dies can be selectively bonded with backplane 322 (e.g., in step 304 of FIG. 3B). For example, referring back to FIG. 3B, testing system 500 can be used to determine that μLED dies 314b and 314d are defective. Based on such determination, no backplane-side bumps are formed at the locations on backplane 322 that correspond to μLED dies 314b and 314d in step 304 of FIG. 3B, and these μLED dies are not transferred to backplane 322 in steps 305 and 306.

As shown in FIG. 5, testing system 500 comprises a power source 502 and a light sensors array 504. Power source 502 can apply electrical signals via device-side bumps 318 and 320 of each μLED die under test (e.g., device-side bumps 318a and 320a of μLED die 314a, device-side bumps 318b and 320b of μLED die 314b, device-side bumps 318c and 320c of μLED die 314c, and device-side bumps 318d and 320d of μLED die 314d, etc.), to activate active layer 108 of each μLED die. Each non-defective μLED dies can emit light 506. Light 506 can propagate through transparent crystalline substrate 308 and reach light sensors array 504. Light sensors array 504 may include an array of light sensors, with each light sensor corresponding to each μLED die under test. Each light sensor can be used to provide a measurement of, for example, an intensity of light emitted by a corresponding μLED die, a width of light beam emitted by the μLED die (which can reflect a degree of collimation of the emitted light), etc. Based on the output of light sensors array 504, it can be determined which of the μLED dies is defective. In the example of FIG. 5, light sensors 504a and 504c receive light 506a and 506b from, respectively, μLED dies 314a and 314c, while light sensors 504b and 504d do not receive light (or light that do not satisfy an intensity and/or beam width threshold) from μLED dies 314b and 314d. Based on the outputs of light sensors 504b and 504d, it can be determined that μLED dies 314b and 314d are defective and not to be transferred to backplane 322.

In the examples of FIG. 3A, FIG. 3B, FIG. 4, and FIG. 5, the laser lift-off (LLO) process used to facilitate selective and parallel transfer of μLED die, as well as the testing for selective transfer of μLED dies, may require substrate 308 to be transparent. For example, for the LLO process to take place in step 305 of FIG. 3B, substrate 308 needs to transmit laser light 350 to reach interfaces 352a-352d, to weaken the bonding between the μLED dies and substrate 308 at the interfaces. Moreover, substrate 308 also needs to transmit light generated by each μLED die under test to light sensors array 504, so that light sensors array 504 can perform measurement of the light to provide indications of which of the μLED dies are defective or non-defective. For fabrication processes that involve fabricating μLED dies on starter substrates that are opaque (e.g., fabrication of red μLED dies on Gallium Arsenide substrates), the opaque starter substrate may block the laser lights and the light generated by the μLED dies, which makes it difficult to perform the LLO process and testing for defective dies.

The present disclosure provides example methods of manufacturing and assembling LED dies that allow LLO process and testing for selective transfer of LED dies to be performed regardless of whether the LED dies are fabricated on a transparent starter substrate or an opaque starter substrate. With the disclosed techniques, LLO process and selective transfer of LED dies, as well as testing of LED dies prior to transfer to backplane, can be used to improve the manufacture efficiency and yield for a wider range of LED devices.

Figure 6:
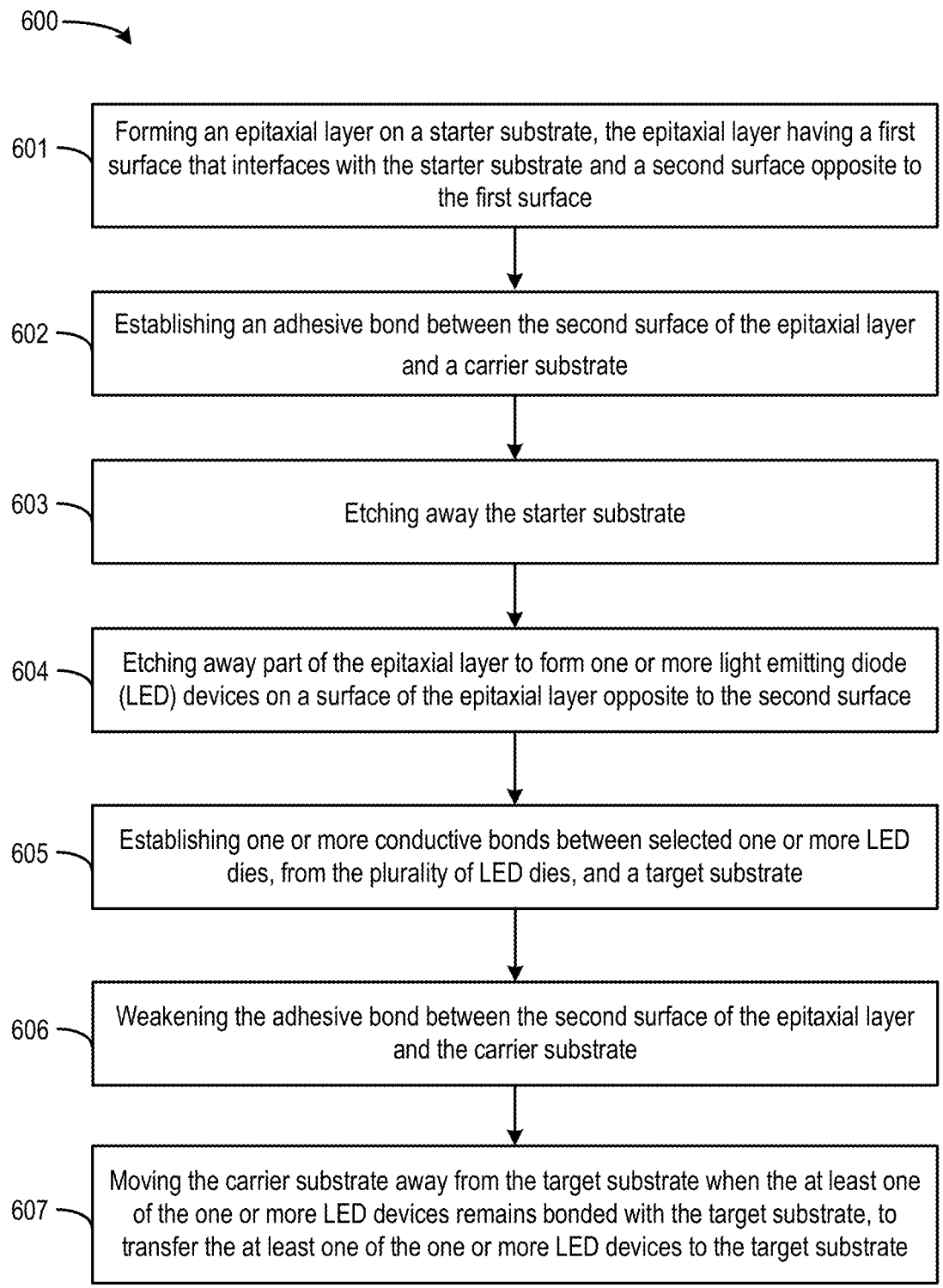
FIG. 6 illustrates an example process of manufacturing and assembling LED devices according to examples of the disclosed techniques.
Figure 7A:
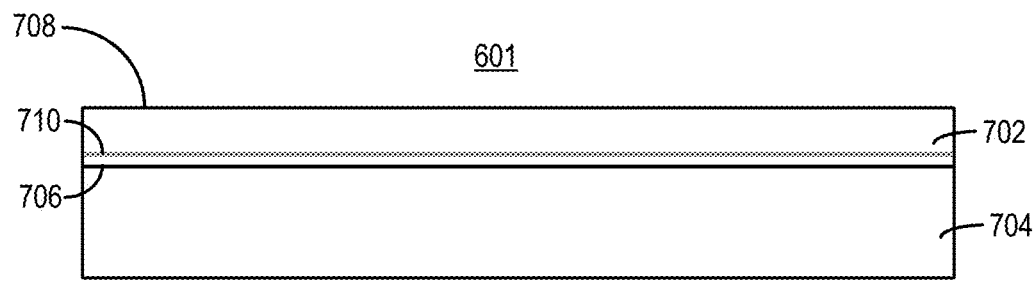
FIG. 7A and FIG. 7B are schematic views illustrating the example process of manufacturing and assembling LED devices of FIG. 6.
Figure 7A:
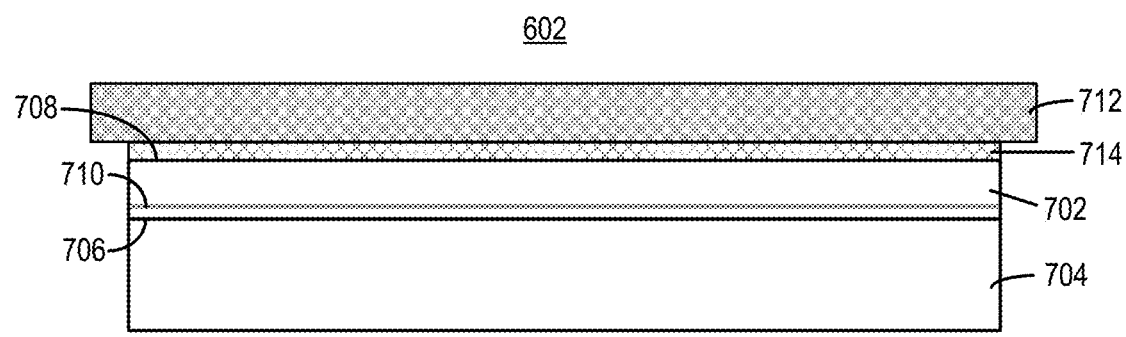
Figure 7A:
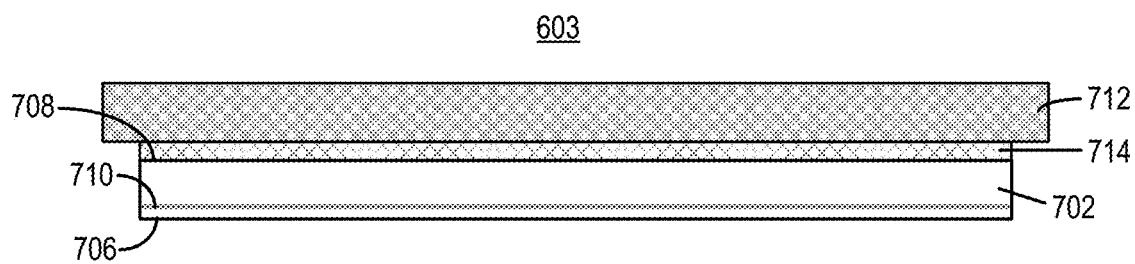
Figure 7A:
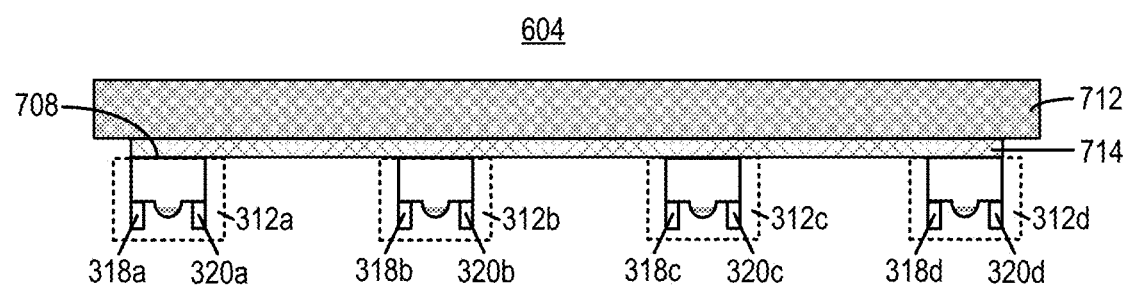
Figure 7B:
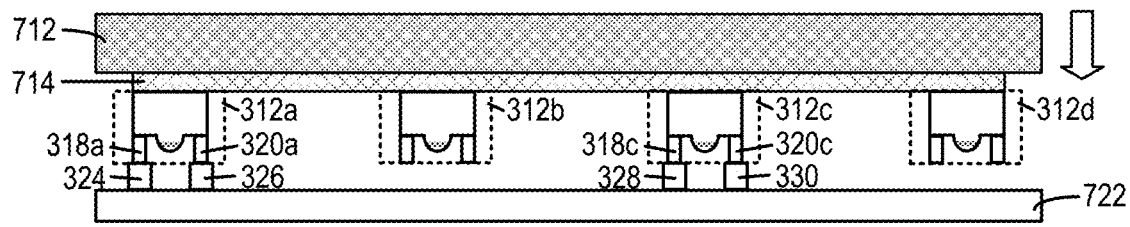
Figure 7B:
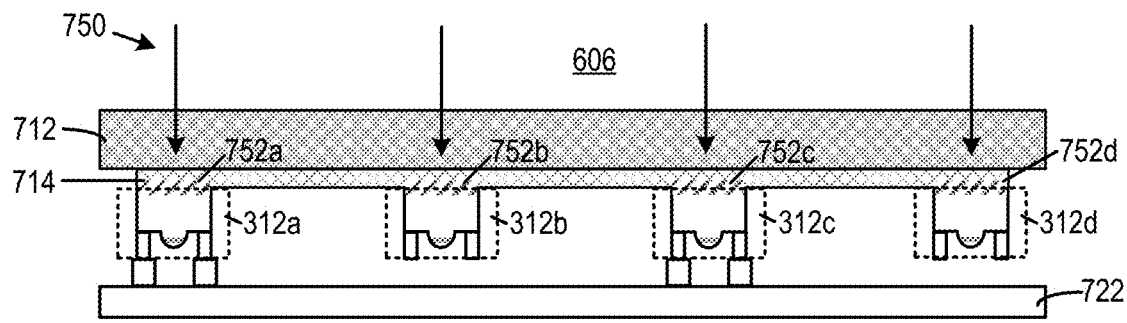
Figure 7B:
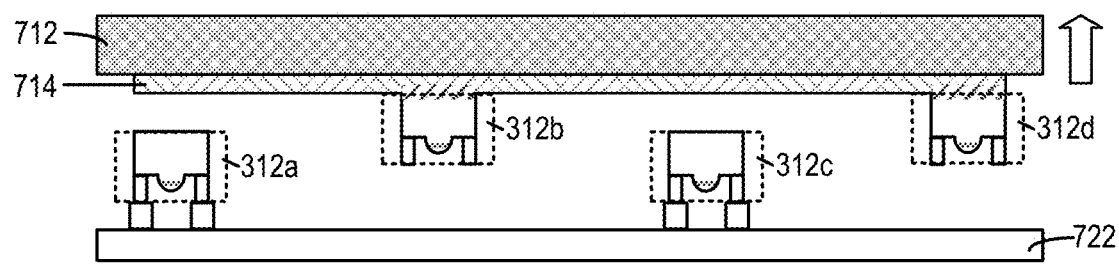

Reference is now made to FIG. 6, FIG. 7A, and FIG. 7B, which illustrate an example of process 600 for manufacturing and assembling LED dies. Process 600 can be used to for manufacturing and assembling μLED dies such as μLED dies 312 of FIG. 3A. It is understood that process 600 can be used for manufacturing and assembling other types of LED dies.

Process 600 starts with step 601, in which an epitaxial layer 702 is formed on a starter substrate 704. Epitaxial layer 702 has a first surface 706 that interfaces with starter substrate 704 and a second surface 708 opposite to first surface 706.

Starter substrate 704 and epitaxial layer 702 may comprise different types of materials, which can also vary depending on the desired light output frequency of the LED being produced. For example, for a blue or green LED, the starter substrate 704 may comprise a sapphire or aluminum oxide ($Al_2O_3$) material, and the epitaxial layer 702 may comprise a gallium nitride (GaN) material. As another example, for a red LED, the starter substrate 704 may comprise opaque (or having low light transmittance) gallium arsenide (GaAs) material, and the epitaxial layer 702 may comprise an aluminum gallium arsenide (AlGaAs) material. Other types of materials may also be used.

Moreover, epitaxial layer 702 further includes a light emitting layer 710 (e.g., a layer including quantum wells) that is closer to first surface 706 than to second surface 708. Due to the location of light emitting layer 710 within epitaxial layer 702 (being closer to first surface 706 than to second surface 706), etching can be performed on first surface 706 to create mesa 106 having sidewalls to internally reflect light generated by light emitting layer 710 towards second surface 708 (which is to be configured as light emitting surface 116 of FIG. 1), as to be described below.

In step 602, a carrier substrate 712 can be adhesively bonded to second surface 708 of epitaxial layer 702 by, for example, forming an adhesive layer 714 between second surface 708 and carrier substrate 712. Carrier substrate 712 can be used to provide structural support for epitaxial layer 702 during the subsequent etching (to fabricate μLED dies) and testing, and to be used as a laser light transmitter to support the LLO process for selective transfer/bonding of the fabricated μLED dies to a backplane. Adhesive layer 714 may include materials such as a glue, a polymer, a wax material, etc. Carrier substrate 712 can include material that is transparent or having sufficiently high light transmittance to allow laser night to pass through in an LLO process and/or to allow light emitted by light emitting layer 710 to pass through in the testing process of FIG. 5. For example, carrier substrate 712 can include glass material. In other examples, carrier substrate 712 can include other suitable transparent or non-transparent materials. The material for carrier substrate 712 may include, for example, doped sapphire (e.g., Titanium doped sapphire), un-doped sapphire, doped silica (e.g., Fluorine doped silica), un-doped silica, polymers (e.g., customized plastics), etc.

As to be discussed in more details below, the use of transparent carrier substrate 712 enables laser lift-off (LLO) process to be used facilitate selective and parallel transfer of μLED dies to be fabricated from epitaxial layer 702, as described in step 305 of FIG. 3B, as well as the testing of the μLED dies for subsequent selective transfer of the μLED dies, as described in FIG. 5. The use of transparent carrier substrate 712 enables the LLO process and testing regardless of whether the μLED dies are formed on opaque (or having low light transmittance) materials such as GaAs.

In step 603, starter substrate 704 can be etched away while epitaxial layer 702, adhesive layer 714, and carrier substrate 712 are retained. Starter substrate 704 can be etched away using, for example, wet etching.

In step 604, part of epitaxial layer 702 can be etched away to form one or more light emitting diode (LED) dies including, for example, μLED dies 312 of FIG. 3A. The etching can be performed on a surface of epitaxial layer 702 opposite to second surface 708, which can include first surface 706 or a new surface formed on epitaxial layer 702 if part of the epitaxial layer is also etched. The etching can create, for example, mesa 106, P-type contact pad 110, and N-type contact pad 112 of FIG. 1. Device-side bumps 318 and 320 (e.g., metallic bumps, conductive epoxy bumps, etc.) can also be formed on the LED dies to provide signals to control the LEDs to emit light. In one example, the etching of first surface 706 can be pre-determined based on light emitting layer 710 being closer to first surface 706 to second surface 708, such that first surface 706 is to be etched to form mesa 106, whereas second surface 708 is configured as light emitting surface 116. In other examples, the decision of etching of first surface 706 can be based on other factors (e.g., due to first surface 706 being exposed after starter substrate 704 is etched away) and not necessarily based on the distances of light emittance layer 710 from first surface 706 and from second surface 708. For example, for some red μLED devices, light emittance layer 710 can be either of equal distance from first surface 706 and second surface 708, or closer to second surface 708 than to first surface 706.

Referring to FIG. 6 and FIG. 7B, in step 605, a subset of the one or more LED dies (e.g., μLED dies 312a and 312c) are selected and conductively bonded with a backplane 72. Backplane 722 can be a backplane that is part of a display. μLED dies 312a and 312c can be selected to be bonded with the backplane. The bonds can be formed, for example, between device-side bumps 318a and 320a and backplane-side bumps 324 and 326, and between device-side bumps 318c and 320c and backplane-side bumps 328 and 330. The bonds between the device-side bumps and the backplane-side bumps are also electrically conductive to create electrical paths between the μLED dies and traces embedded in backplane 204. The electrical paths enables transmission of control signals and electric currents to the μLED devices.

To perform the conductive bonding of μLED dies 312a and 312c with backplane 722, contacts 324, 326, 328, and 330 (e.g., metallic contacts, conductive epoxy contacts, etc.) can be formed on locations on backplane 722 that correspond to μLED dies 312a and 312c. Carrier substrate 712 can be brought towards backplane 722 (e.g., by a PUT) to enable device-side bumps 318a, 320a, 318c, and 320c of μLED dies 312a and 312c to become in contact with and bonded with backplane-side bumps 324, 326, 328, and 330 on backplane 722. A second bonding layer comprising device-side bumps 318a, 320a, 318c, and 320c and backplane-side bumps 324, 326, 328, and 330 can be formed. At least one of carrier substrate 712 and backplane 722 can be subject to heating to form bonding between the bumps and the contacts.

The selective bonding of μLED dies in step 605 is useful for a variety of applications. Just as step 304 of FIG. 3A, selective and parallel bonding of μLED dies 314a and 314c (but not μLED dies 314b and 314d) with backplane 722 can be performed in step 605. The parallel bonding enables simultaneous transfer of a large number of μLED dies to backplane 722, which can substantially increase the speed of transferring the μLED dies to the backplane (e.g., compared with picking up and releasing individual μLED die sequentially), which in turn speeds up the manufacture of the displays.

Moreover, selective bonding also enables measures to be taken to only select non-defective μLED dies for transfer to backplane 722, which can further improve the manufacture yield of the displays. For example, based on a testing result from testing system 500, defective μLED dies can be deselected from being transferred to backplane 722, whereas non-defective μLED dies can be selectively bonded with backplane 722 (e.g., in step 304 of FIG. 3B). Based on such determination, no backplane-side bumps are formed at the locations on backplane 722 that correspond to μLED dies 314b and 314d in step 304 of FIG. 3B, and these μLED dies are not transferred to backplane 722 in subsequent steps 606 and 607.

Further, the selective bonding in step 605 can also be used for transfer of μLED dies to different display planes with a single pick up by the PUT, as described above with respect to FIG. 4. Just as step 402 of FIG. 4, a PUT can perform a single pick up of carrier substrate 712 having multiple μLED dies in step 605, and then transfer subsets of the μLED dies to different display planes, which is substantially faster than, for example, operating the PUT to pick up and place each μLED die individually and sequentially onto each backplane.

In step 606, the adhesive bonds between the μLED dies 312a, 312b, 312c, and 312d and carrier substrate 712 can be weakened by a LLO process. As shown in FIG. 7B, the LLO process can include transmitting laser light 750 via transparent carrier substrate 712 to melt portions of adhesive layer 714 at interfaces 752a, 752b, 752c, and 752d between carrier substrate 712 and each of μLED dies 312a, 312b, 312c, and 312d, to weaken the adhesive bonds at the interfaces.

In both steps 605 and 606, the use of transparent (or at least non-opaque) carrier substrate 712 allows LLO process and testing of μLED dies 312a, 312b, 312c, and 312d for subsequent selective transfer regardless of whether starter substrate 712 is transparent (or having low light transmittance), as in a case where μLED dies 312a, 312b, 312c, and 312d contain red μLED devices fabricated on a GaAs substrate. For example, as part of step 605, μLED dies 312a, 312b, 312c, and 312d can be subject to testing using testing system 500, where carrier substrate 712 allows at least certain amount of light emitted by the μLED dies to propagate through to reach light sensor array 504. Also, as part of step 606, carrier substrate 712 can also laser light 750 of the LLO process to propagate through to reach interfaces 752a-752d to weaken the bonds at the interface. The use of transparent carrier substrate 712 allows the use of LLO process and testing that would otherwise not available for manufacture of red μLED dies on opaque starter substrate, which in turn can improve the manufacture efficiency and yield of displays including red μLED dies.

Moreover, it is also understood that carrier substrate 712 can have a certain degree of light transmittance that is sufficient for both the LLO process and testing and need not have 100% light transmittance. For example, carrier substrate 712 can have a pre-determined light transmittance sufficient to pass laser light 750 such that the intensity of the laser light, when reaching interfaces 752a-752d, has sufficient intensity to melt the portions of adhesive layer 714 at the interfaces. Moreover, carrier substrate 712 can also have a pre-determined light transmittance sufficient to pass light generated by light emitting layer 710 of the μLED dies under test, such that the intensity of the light is sufficiently high to be detected by the light sensor array 504.

In step 607, carrier substrate 712 can be moved away (e.g., by the PUT) from backplane 722 when μLED dies 312a and 312c remain bonded with backplane 722, to transfer μLED dies 312a and 312c to backplane 722. Due to the weakening of the bonds at interfaces 752a and 752c, μLED dies 312a and 312c can be separated from adhesive layer 714 and remain bonded (conductively) to backplane 722 via the second bonding layer.

As described above, in process 700, a single transparent (or non-opaque) carrier substrate (carrier substrate 712) is adhered to second surface 708 of epitaxial layer 702 to provide structure support during the etching of first surface 706 to fabricate μLED dies, and to propagate light through second surface 708 to support the LLO process and to support testing by testing system 500. The etching of first surface 706 to fabricate μLED dies can be pre-determined based on light emitting layer 710 being closer to first surface 706 than to second surface 708, such that first surface 706 is to be etched to form mesa 106, whereas second surface 708 can be configured as light emitting surface 116.

On the other hand, in a case where light emitting layer 710 is closer to second surface 708 than to first surface 706, μLED dies can be fabricated by etching second surface 708 to form mesa 106, whereas first surface 706 can be configured as light emitting surface 116. In such a case, two carrier substrates can be used, with a first carrier substrate being adhered to second surface 708 to provide structure support for epitaxial layer 702 while starter substrate 712 is being etched away. After starter substrate 712 is etched away to expose first surface 706, a second carrier substrate can be adhered to first surface 706, and the first carrier substrate can be removed to expose second surface 708. Etching can be performed on second surface 708 to form μLED dies, with the second carrier substrate being used to provide structure support during the etching of second surface 708 to fabricate μLED dies, and to propagate light through first surface 706 to support the LLO process and to support testing by testing system 500. The etching of second surface 708 to fabricate μLED dies can be pre-determined based on light emitting layer 710 being closer to second surface 708 than to first surface 706, such that second surface 708 is to be etched to form mesa 106, whereas first surface 706 can be configured as light emitting surface 116.

Figure 8:
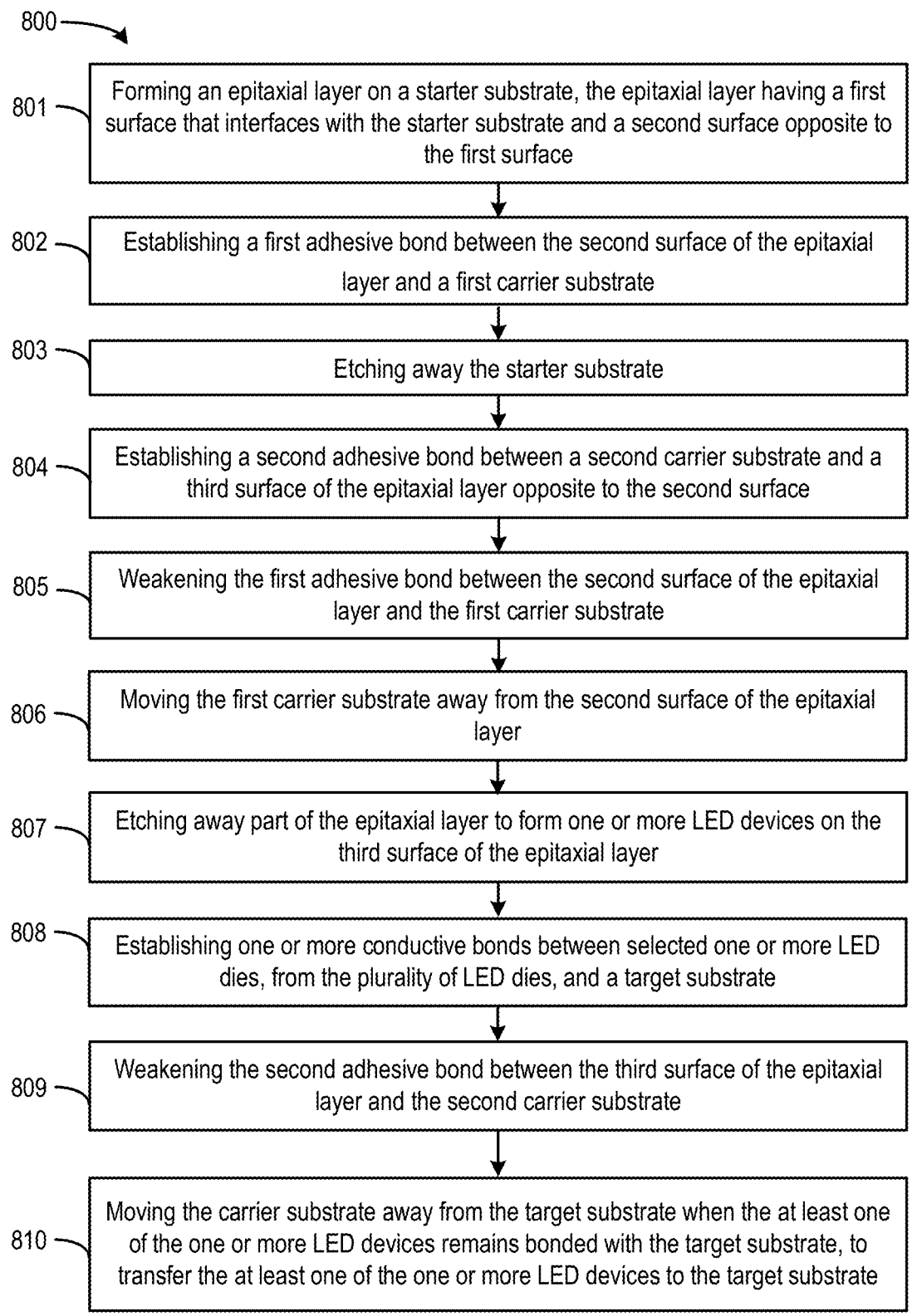
FIG. 8 illustrates an example process of manufacturing and assembling LED devices according to examples of the disclosed techniques.
Figure 9A:
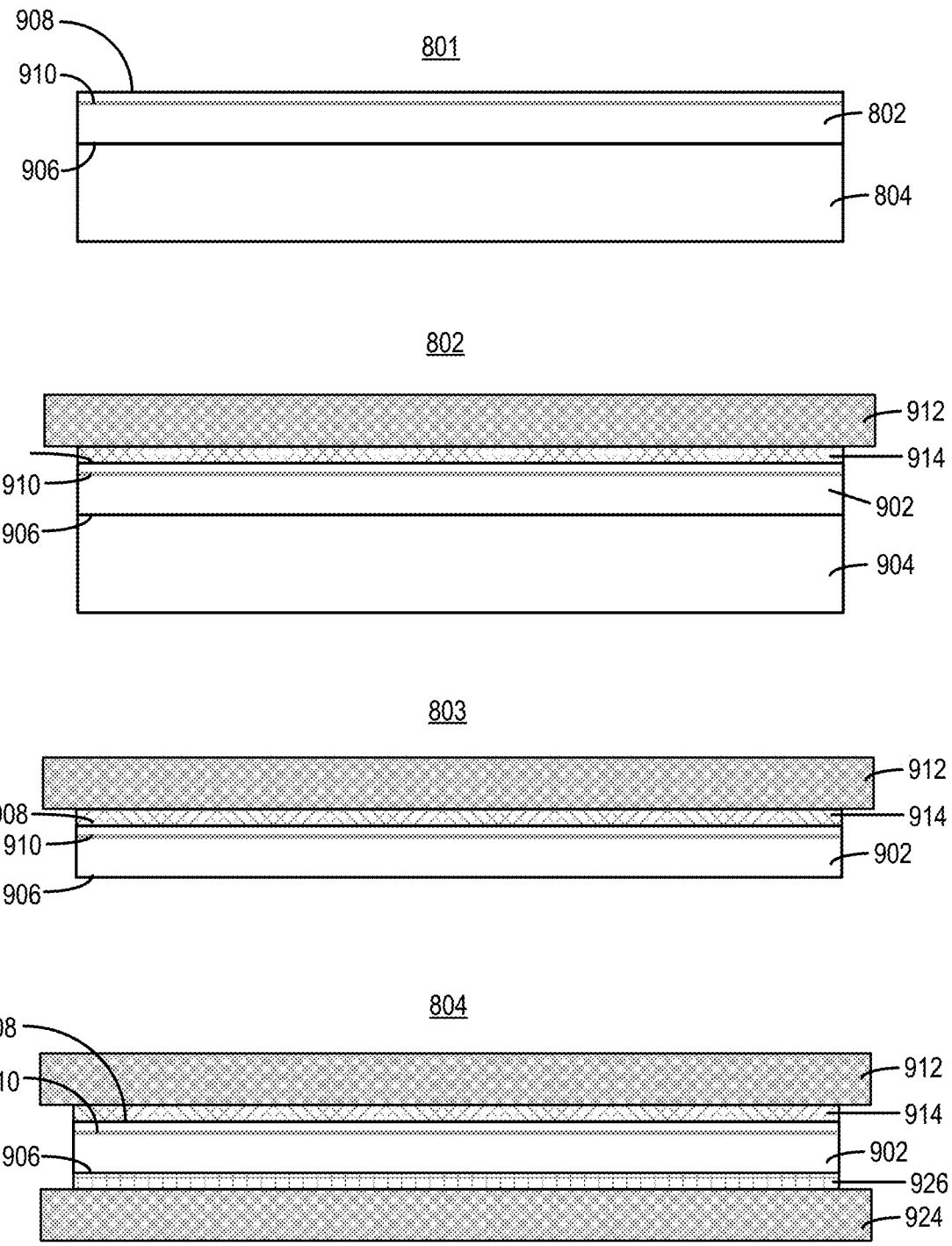
FIG. 9A, FIG. 9B, and FIG. 9C are schematic views illustrating the example process of manufacturing and assembling LED devices of FIG. 8.

Reference is now made to FIG. 8, FIG. 9A, FIG. 9B, and FIG. 9C, which illustrate an example of process 800 for manufacturing and assembling LED dies, including μLED dies, using two carrier substrates. It is understood that process 800 is applicable for different types of LED devices. Referring to FIG. 8 and FIG. 9A, process 800 starts with step 801, in which an epitaxial layer 902 is formed on a starter substrate 904. Epitaxial layer 802 has a first surface 906 that interfaces with starter substrate 904 and a second surface 908 opposite to first surface 906. Starter substrate 904 may include, for example, a non-transparent Gallium Arsenide (GaAs) substrate, and epitaxial layer 902 may also include GaAs material. Epitaxial layer 902 includes a light emitting layer 910 (e.g., a layer including quantum wells) that is closer to second surface 908 than to first surface 906.

In step 802, a first carrier substrate 912 can be adhesively bonded to second surface 908 of epitaxial layer 902 by, for example, forming a first adhesive layer 914 between second surface 908 and carrier substrate 912. First adhesive layer 914 may include materials such as a glue, a polymer, a wax material, etc. First carrier substrate 912 can include, for example, transparent materials (e.g., a glass substrate), or a non-opaque material having a pre-determined light transmittance to allow subsequent LLO process.

In step 803, starter substrate 904 can be etched away while epitaxial layer 902, first adhesive layer 914, and first carrier substrate 912 are retained. Starter substrate 904 can be etched away using, for example, wet etching.

In step 804, a second carrier substrate 924 can be adhesively bonded to a surface opposite to second surface 908 of epitaxial layer 902. The surface may include, for example, first surface 906 of epitaxial layer 902, or a new surface formed on epitaxial layer 902 if part of the epitaxial layer is etched. The adhesion can be performed by, for example, forming a second adhesive layer 926. Second adhesive layer 926 may include materials such as a glue, a polymer, a wax material, etc. Second carrier substrate 924 can include, for example, transparent materials (e.g., a glass substrate), or a non-opaque material having a pre-determined light transmittance to enable subsequent LLO process.

Figure 9B:
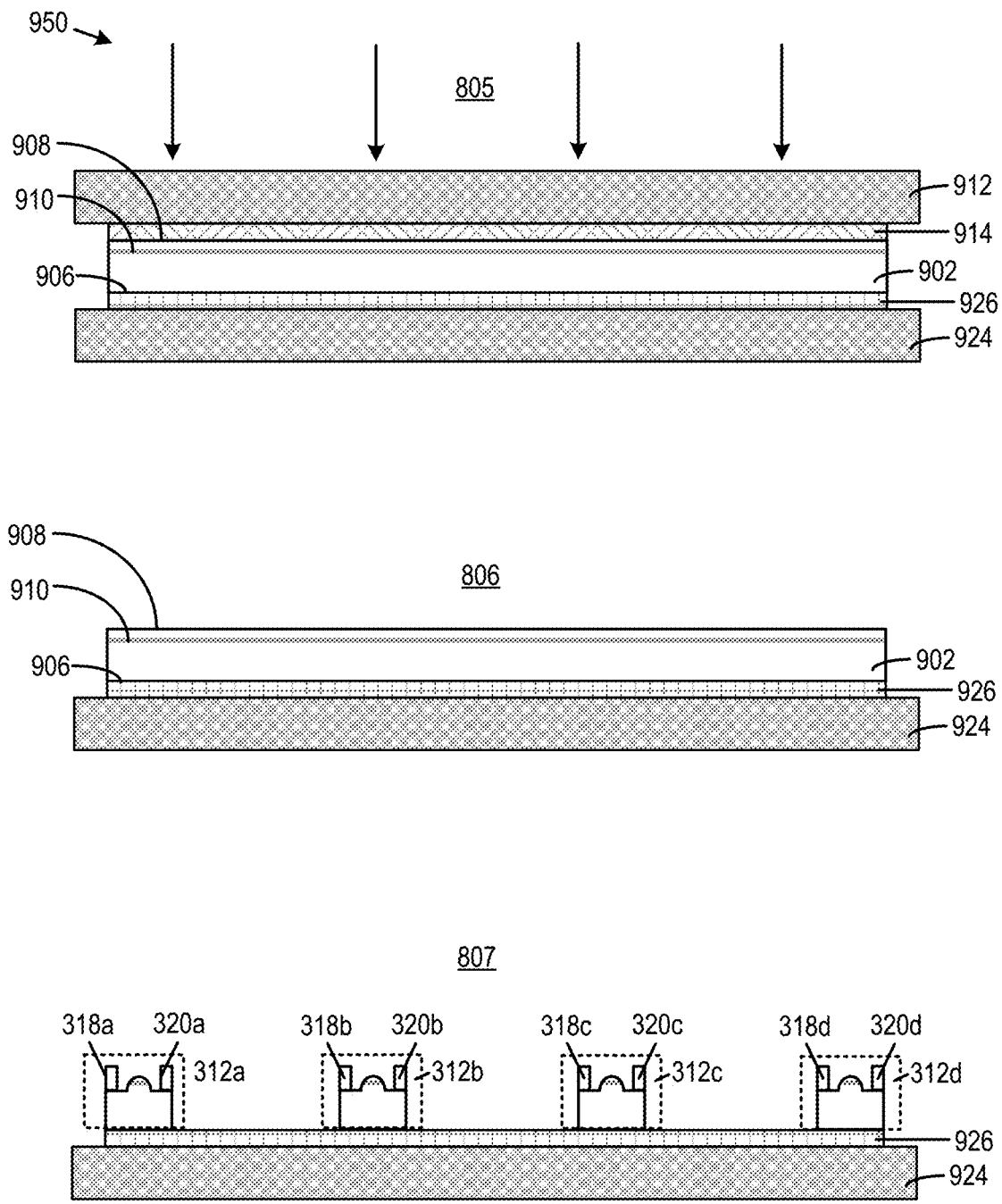

Referring to FIG. 8 and FIG. 9B, in step 805, the adhesive bond between first carrier substrate 912 and second surface 908 of epitaxial layer 902 can be weakened by an LLO process. As shown in FIG. 9B, the LLO process can include transmitting laser light 950 via transparent carrier substrate 912 to melt first adhesive layer 914.

In step 806, first carrier substrate 912 can be separated from second surface 908. The separation can be performed by, for example, heating first carrier substrate 912 to a temperature that is sufficient to melt first adhesive layer 914 but insufficient to melt second adhesive layer 926. In some examples, first carrier substrate 912 can be transparent, and laser light (e.g., as part of the LLO process) can be transmitted via first carrier substrate 912 to melt first adhesive layer 914, to facilitate the separation of first carrier substrate 912 from second surface 908. Second surface 908 can be exposed as a result.

In step 807, part of epitaxial layer 902 can be etched away to form one or more light emitting diode (LED) dies including, for example, μLED dies 312 of FIG. 3A. The etching can be performed at second surface 908 of epitaxial layer 902 (or a surface of epitaxial layer 702 opposite to first surface 906). Device-side bumps 318 and 320 (e.g., metallic bumps, conductive epoxy bumps, etc.) can also be formed on the LED dies to provide signals to control the LEDs to emit light.

Figure 9C:
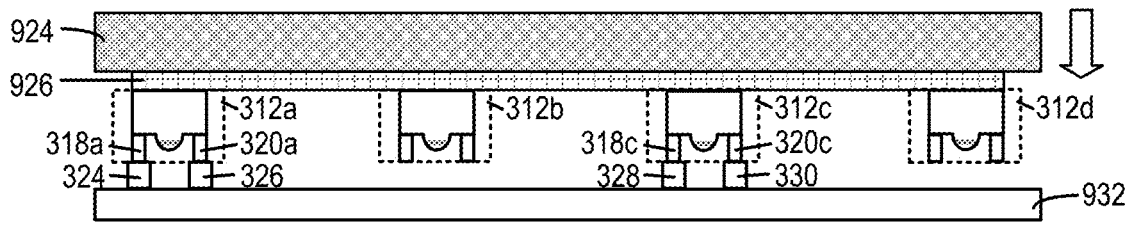
Figure 9C:
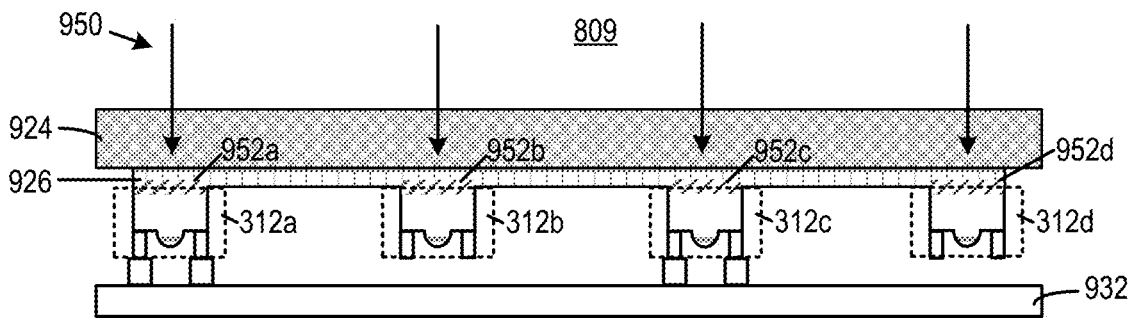
Figure 9C:
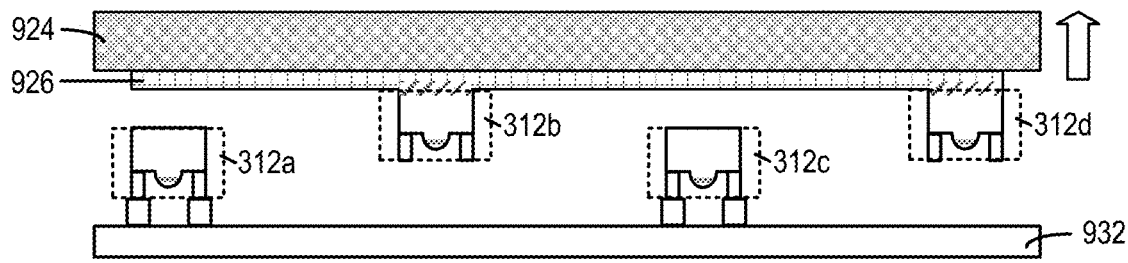

Referring to FIG. 8 and FIG. 9C, in step 807, a subset of the one or more LED dies (e.g., μLED dies 312a and 312c) are selected to be conductively bonded with a backplane 932. Backplane 932 can be a backplane that is part of a display. μLED dies 312a and 312c can be selected to be bonded with the backplane based on the result of testing the LED dies using, for example, testing system 500. To perform the bonding of μLED dies 312a and 312c with backplane 932, backplane-side bumps 324, 326, 328, and 330 (e.g., metallic bumps, conductive epoxy bumps, etc.) can be formed on locations on backplane 932 that correspond to μLED dies 312a and 312c. Second carrier substrate 924 can be brought towards backplane 932 (e.g., by a PUT) to enable device-side bumps 318a, 320a, 318c, and 320c of μLED dies 312a and 312c to become in contact with and conductively bonded with backplane-side bumps 324, 326, 328, and 330 on backplane 932. A conductive bonding layer comprising device-side bumps 318a, 320a, 318c, and 320c and backplane-side bumps 324, 326, 328, and 330 can be formed. At least one of second carrier substrate 924 or backplane 932 can be subject to heating to form the conductively bonding between the device-side bumps and the backplane-side bumps.

In step 809, the adhesive bond between the μLED dies 312a, 312b, 312c, and 312d and second carrier substrate 924 can be weakened. In some examples, the weakening of the adhesive bond can be performed by the LLO process which includes transmitting laser light 950 via the carrier substrate (or the another carrier substrate) to melt portions of second adhesive layer 926 at interfaces 952a, 952b, 952c, and 952d between second carrier substrate 924 and each of μLED dies 312a, 312b, 312c, and 312d. Just as the use of transparent (or at least non-opaque) carrier substrate 712, the use of transparent second carrier substrate 924 allows LLO process to be applied regardless of whether starter substrate 904 is transparent or opaque.

In step 810, second carrier substrate 924 can be moved away (e.g., by the PUT) from backplane 932 when μLED dies 312a and 312c remain bonded with backplane 932, to transfer μLED dies 312a and 312c to backplane 932. Due to the weakening of the bonds at interfaces 952a and 952c, μLED dies 312a and 312c can be separated from adhesive layer 714 and remain bonded to backplane 932 via the bonding layer.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method, comprising:
    forming an epitaxial layer on a starter substrate;
    attaching the epitaxial layer onto a carrier substrate;
    etching away the starter substrate;
    etching away part of the epitaxial layer to form a plurality of light emitting diode (LED) dies;
    establishing one or more conductive bonds between one or more LED dies of the plurality of LED dies and a backplane;
    using a light directed through the carrier substrate to weaken a bond between the epitaxial layer and the carrier substrate; and
    moving the carrier substrate away from the backplane to transfer the one or more LED dies to the backplane.

2. The method of claim 1,
    wherein the epitaxial layer has a first surface that interfaces with the starter substrate and a second surface opposite to the first surface;
    wherein the epitaxial layer further includes a quantum well layer to generate light; and
    wherein the quantum well layer is positioned closer to the first surface than to the second surface.

3. The method of claim 1, wherein the starter substrate is opaque.

4. The method of claim 3, wherein the starter substrate includes Gallium Arsenide material.

5. The method of claim 1, wherein the carrier substrate includes glass.

6. The method of claim 5, further comprising forming an adhesive layer between the epitaxial layer and the carrier substrate,
    wherein the epitaxial layer comprises at least one of: a polymer, a glue, or wax.

7. The method of claim 6, wherein the light is laser light; and
    wherein the laser light is directed through the carrier substrate to melt the adhesive layer to weaken at least a portion of the adhesive layer.

8. The method of claim 1, further comprising:
    forming device-side bumps on the plurality of LED dies;
    forming backplane-side bumps on at least one of one or more pre-determined locations on the backplane, the at least one of one or more pre-determined locations corresponding to the selected one or more LED dies; and
    establishing the one or more conductive bonds between the device-side bumps on the selected one or more LED dies and the backplane-side bumps on the backplane.

9. The method of claim 8, further comprising:
    heating the device-side bumps and the backplane-side bumps to a pre-determined temperature to form the one or more conductive bonds between the device-side bumps on the selected one or more LED dies and the backplane-side bumps on the backplane.

10. The method of claim 1, wherein the backplane is a first backplane;
    wherein the one or more LED dies are first selected one or more LED dies;
    wherein the one or more conductive bonds are first one or more conductive bonds;
    and wherein the method further comprises:
        moving, using a pick up tool (PUT), the carrier substrate towards the first backplane to establish the first one or more conductive bonds between the first selected one or more LED dies and the first backplane;
        moving, using the PUT, the carrier substrate away from the first backplane to transfer the first selected one or more LED dies to the first backplane;
        moving, using the PUT, the carrier substrate towards a second backplane to establish second one or more conductive bonds between second selected one or more LED dies and the second backplane; and
        moving, using the PUT, the carrier substrate away from second backplane to transfer the second selected one or more LED dies to the second backplane.

11. The method of claim 1, further comprising:
    applying a signal to each of the plurality of LED dies to control each of the plurality of LED dies to emit light;
    collecting, using a light sensor array and via the carrier substrate, light emitted by one or more LEDs of the plurality of LED dies in response to the signal; and
    selecting, based on an output of the light sensor array and from the plurality of LED dies, the one or more LED dies to establish the one or more conductive bonds with the backplane.

12. The method of claim 1, wherein the backplane comprises a thin film transistor (TFT) backplane.

13. The method of claim 1, wherein the the plurality of LED dies are formed on a surface of the epitaxial layer that interfaces with the starter substrate.

14. A method, comprising:
    forming an epitaxial layer on a starter substrate attaching the epitaxial layer onto a first carrier substrate;
    etching away the starter substrate;
    attaching the epitaxial layer onto a second carrier substrate;
    moving the first carrier substrate away from the epitaxial layer;
    etching away part of the epitaxial layer to form a plurality of light emitting diode (LED) dies on the epitaxial layer;
    establishing one or more conductive bonds between one or more LED dies of the plurality of LED dies and a backplane;
    using a light directed through the second carrier substrate to weaken a bond between the epitaxial layer and the second carrier substrate; and
    moving the second carrier substrate away from the backplane to transfer the one or more LED dies to the backplane.

15. The method of claim 14,
wherein the epitaxial layer has a first surface that interfaces with the starter substrate and a second surface opposite to the first surface;
wherein the epitaxial layer further includes a quantum well layer to generate light; and
wherein the quantum well layer is positioned closer to the second surface than to the first surface.

16. The method of claim 14, wherein the starter substrate includes Gallium Arsenide material.

17. The method of claim 14, wherein the first carrier substrate and the second carrier substrate include glass; and
wherein the method further comprises:
using a light directed through the first carrier substrate to weaken a first adhesive bond between the epitaxial layer and the first carrier substrate; and
wherein the bond between the epitaxial layer and the second carrier substrate comprises a second adhesive bond.

18. The method of claim 17, further comprising forming a first adhesive layer between the epitaxial layer and the first carrier substrate, the first adhesive layer comprising at least one of: a polymer, a glue, or wax; and
forming a second adhesive layer between the epitaxial layer and the second carrier substrate, the second adhesive layer comprising at least one of: a polymer, a glue, or wax.

19. The method of claim 18, wherein the light is laser light; and
wherein the laser light is directed through the first carrier substrate to melt the first adhesive layer to weaken the first adhesive bond; and
wherein the laser light is directed through the second carrier substrate to melt the second adhesive layer to weaken the second adhesive bond.

20. The method of claim 14, wherein the plurality of LED dies are formed on a surface of the epitaxial layer that previously interfaced with the starter substrate.

* * * * *